US008422691B2

(12) United States Patent
Asada et al.

(10) Patent No.: US 8,422,691 B2
(45) Date of Patent: Apr. 16, 2013

(54) AUDIO OUTPUTTING DEVICE, AUDIO OUTPUTTING METHOD, NOISE REDUCING DEVICE, NOISE REDUCING METHOD, PROGRAM FOR NOISE REDUCTION PROCESSING, NOISE REDUCING AUDIO OUTPUTTING DEVICE, AND NOISE REDUCING AUDIO OUTPUTTING METHOD

(75) Inventors: Kohei Asada, Kanagawa (JP); Toru Sasaki, Tokyo (JP)

(73) Assignee: Sony Corporation, Tokyo (JP)

( * ) Notice: Subject to any disclaimer, the term of this patent is extended or adjusted under 35 U.S.C. 154(b) by 1223 days.

(21) Appl. No.: 11/936,876

(22) Filed: Nov. 8, 2007

(65) Prior Publication Data

US 2008/0159555 A1 Jul. 3, 2008

(30) Foreign Application Priority Data

Dec. 27, 2006 (JP) ................................ 2006-350961

(51) Int. Cl.
*G10K 11/16* (2006.01)
*H03G 9/00* (2006.01)

(52) U.S. Cl.
USPC .......................................... 381/71.1; 381/103

(58) Field of Classification Search ................. 381/71.1, 381/71.6, 74, 103, 98, 104, 107
See application file for complete search history.

(56) References Cited

U.S. PATENT DOCUMENTS

| | | | | |
|---|---|---|---|---|
| 5,276,740 | A | 1/1994 | Inanaga et al. | |
| 5,895,878 | A * | 4/1999 | Ishibashi | 84/626 |
| 6,260,765 | B1 * | 7/2001 | Natale et al. | 236/47 |
| 7,925,029 | B2 * | 4/2011 | Hollemans et al. | 381/74 |
| 2001/0046304 | A1 * | 11/2001 | Rast | 381/74 |
| 2009/0046868 | A1 * | 2/2009 | Engle et al. | 381/74 |

FOREIGN PATENT DOCUMENTS

| | | | |
|---|---|---|---|
| CN | 1774953 | | 5/2006 |
| GB | 2 436 657 | A | 10/2007 |
| JP | 2778173 | | 5/1998 |
| JP | 10-177395 | | 6/1998 |
| JP | 10-271076 | | 10/1998 |
| JP | 11-119781 | | 4/1999 |
| WO | WO 00/06066 | | 2/2000 |
| WO | WO 2004/093490 | A1 | 10/2004 |
| WO | WO 2006/094739 | A1 | 9/2006 |

OTHER PUBLICATIONS

U.S. Appl. No. 11/936,894, filed Nov. 8, 2007, Asada, et al.
U.S. Appl. No. 11/865,419, filed Oct. 1, 2007, Asada, et al.
U.S. Appl. No. 11/865,354, filed Oct. 1, 2007, Asada.
U.S. Appl. No. 11/868,815, filed Oct. 8, 2007, Itabashi, et al.
U.S. Appl. No. 11/875,374, filed Oct. 19, 2007, Asada.

(Continued)

*Primary Examiner* — Xu Mei
*Assistant Examiner* — David Ton
(74) *Attorney, Agent, or Firm* — Oblon, Spivak, McClelland, Maier & Neustadt, L.L.P.

(57) ABSTRACT

Disclosed herein is an audio outputting device for switching a plurality of processes to perform a process on an audio signal, and acoustically reproducing and outputting the audio signal, the audio outputting device including, a control section for, when changing a process performed on an audio signal from one process to another process, stopping the one process on the audio signal, outputting sound based on the audio signal unprocessed by either of the one process and the other process, and performing the other process on the audio signal after passage of a predetermined period of time.

20 Claims, 31 Drawing Sheets

OTHER PUBLICATIONS

U.S. Appl. No. 11/936,882, filed Nov. 8, 2007, Asada, et al.
U.S. Appl. No. 11/952,468, filed Dec. 7, 2007, Asada, et al.
U.S. Appl. No. 11/966,168, filed Dec. 28, 2007, Ohkuri, et al.
U.S. Appl. No. 11/966,452, filed Dec. 28, 2007, Itabashi, et al.
U.S. Appl. No. 12/015,824, filed Jan. 17, 2008, Asada, et al.
Office Action issued Sep. 6, 2011, in Japanese Patent Application No. 2006-350961.
Chinese Office Action with English translation mailed Sep. 30, 2010, in Chinese Patent Application No. 2007-10305908.3.

* cited by examiner

FIG. 4

$$P = \frac{1}{1 + ADHM\beta} N + \frac{AHD}{1 + ADHM\beta} ES \quad \cdots \text{ EQUATION 1}$$

$$\left| \frac{1}{1 + ADHM\beta} \right| < 1 \quad \cdots \text{ EQUATION 2}$$

$$E = (1 + ADHM\beta) \quad \cdots \text{ EQUATION 3}$$

$$P = \frac{1}{1 + ADHM\beta} N + ADHS \quad \cdots \text{ EQUATION 4}$$

$$P = -F' ADHM\alpha N + FN + ADHS \quad \cdots \text{ EQUATION 5}$$

$$P = -F' ADHM\alpha \quad \cdots \text{ EQUATION 6}$$

$$P = ADHS \quad \cdots \text{ EQUATION 7}$$

AUDIO OUTPUTTING DEVICE, AUDIO OUTPUTTING METHOD, NOISE REDUCING DEVICE, NOISE REDUCING METHOD, PROGRAM FOR NOISE REDUCTION PROCESSING, NOISE REDUCING AUDIO OUTPUTTING DEVICE, AND NOISE REDUCING AUDIO OUTPUTTING METHOD

CROSS REFERENCES TO RELATED APPLICATIONS

The present invention contains subject matter related to Japanese Patent Application JP 2006-350961 filed in the Japan Patent Office on Dec. 27, 2006, the entire contents of which being incorporated herein by reference.

BACKGROUND OF THE INVENTION

1. Field of the Invention

The present invention relates to an audio outputting device such for example as a headphone device and a noise reducing audio outputting device. The present invention also relates to a noise reducing device used in these devices and a program for noise reduction processing.

2. Description of the Related Art

With the spread of portable type audio players, a noise reducing system that reduces noise of an external environment and thus provides a listener with a good reproduced sound field space in which the external noise is reduced has begun to be spread for use in headphones and earphones for the portable type audio players.

An example of this kind of noise reducing system is an active type noise reducing system that performs active noise reduction and which basically has the following constitution. External noise is collected by a microphone as acoustic-to-electric converting means. A noise reducing audio signal of acoustically opposite phase from the noise is generated from an audio signal of the collected noise. The generated noise reducing audio signal is acoustically reproduced by a speaker as electric-to-acoustic converting means, whereby the noise reducing audio signal and the noise are acoustically synthesized. Thus the noise is reduced (see Patent Document 1 (Japanese Patent No. 2778173)).

In this active type noise reducing system, in the past, a part for generating the noise reducing audio signal is formed by an analog circuit (analog filter), and is fixed as a filter circuit that can perform some degree of noise reduction in any noise environment.

SUMMARY OF THE INVENTION

Generally, noise environment characteristics differ greatly according to the environment of a place such as an airport, a platform in a railway station, a factory, or the like even when the noise environment characteristics are observed as frequency characteristics. It is therefore normally desirable that an optimum filter characteristic adjusted to each noise environment characteristic be used as a filter characteristic for noise reduction.

However, as described above, the conventional active type noise reducing system is fixed to a filter circuit having a single filter characteristic such as can perform some degree of noise reduction in any noise environment. The active type noise reducing system in the past has a problem of being unable to perform noise reduction adapted to the noise environment characteristic of a place where the noise reduction is to be performed.

Accordingly, a plurality of filter circuits with various filter characteristics may be provided in place of a filter circuit with a single filter characteristic, so that a filter circuit suitable to the noise environment characteristic of a place is selected by switching.

At this time, a listener checks by listening to sound which filter circuit selected by switching exerts an optimum noise reducing (noise canceling) effect. However, when a filter characteristic is switched in a state in which a noise reducing filter effect being produced, it is difficult to check the noise reduction effect of each filter characteristic.

It is desirable to provide a device and a method that solves problems as described above.

According to an embodiment of the present invention, there is provided an audio outputting device for switching a plurality of processes to perform a process on an audio signal, and acoustically reproducing and outputting the audio signal, the audio outputting device including:

a control section for, when changing a process performed on an audio signal from one process to another process, stopping the one process on the audio signal, outputting sound based on the audio signal unprocessed by either of the one process and the other process, and performing the other process on the audio signal after passage of a predetermined period of time.

According to another embodiment of the present invention, there is provided an audio outputting method for switching a plurality of processes to perform a process on an audio signal, and acoustically reproducing and outputting the audio signal, the audio outputting method including the step of:

controlling, when changing a process performed on an audio signal from one process to another process, stopping the one process on the audio signal, outputting sound based on the audio signal unprocessed by either of the one process and the other process, and performing the other process on the audio signal after passage of a predetermined period of time.

According to yet another embodiment of the present invention, there is provided a noise reducing device including:

a sound collecting section for collecting sound and outputting a noise signal;

a noise reducing audio signal generating section for generating a noise reducing audio signal on a basis of the noise signal and a predetermined noise reducing characteristic;

a switching section for switching the noise reducing characteristic of the noise reducing audio signal generating section;

a control section for, when making the switching section switch the predetermined noise reducing characteristic from one noise reducing characteristic to another noise reducing characteristic, making the noise reducing audio signal generating section generate the noise reducing audio signal on a basis of the other noise reducing characteristic after stopping generation of the noise reducing audio signal by the noise reducing audio signal generating section for a predetermined period of time; and an electric-to-acoustic converting section for acoustically reproducing sound on a basis of the noise reducing audio signal.

According to yet another embodiment of the present invention, there is provided a noise reducing method including the steps of:

a sound collecting section collecting sound and outputting a noise signal;

generating a noise reducing audio signal on a basis of the noise signal and a predetermined noise reducing characteristic;

switching the predetermined noise reducing characteristic in the noise reducing audio signal generating step;

controlling, when making the predetermined noise reducing characteristic switched from one noise reducing characteristic to another noise reducing characteristic in the switching step, making generation of the noise reducing audio signal on a basis of the other noise reducing characteristic in the noise reducing audio signal generating step started after stopping generation of the noise reducing audio signal in the noise reducing audio signal generating step for a predetermined period of time; and an electric-to-acoustic converting section to acoustically reproduce sound on a basis of the noise reducing audio signal.

According to an embodiment of the present invention, a process off period during which a process on an audio signal is typically stopped in effect once is provided at a time of switching and changing the process on the audio signal. Therefore, by comparing sound during the process off period with sound resulting from a subsequent process, a user can easily check the effect of the process.

According to another embodiment of the present invention, the switching means can switch and change noise reducing characteristics according to various noise environments, so that an excellent noise reduction effect can be expected at all times. In addition, an effect off period during which sound unprocessed by a noise reducing process is typically output once is provided at a time of switching and changing noise reducing characteristics. Therefore, by comparing a noise condition at a listening position during the effect off period with a noise condition resulting from a subsequent noise reducing process at the listening position, a user can easily check the effect of the noise reducing process.

BRIEF DESCRIPTION OF THE DRAWINGS

FIG. 4 is a diagram of assistance in explaining the embodiment of the noise reducing device according to the present invention;

DETAILED DESCRIPTION OF THE PREFERRED EMBODIMENTS

Several embodiments of the present invention will hereinafter be described with reference to the drawings. Incidentally, each of the embodiments to be described below is a case where an embodiment of a noise reducing device according to the present invention is applied to a headphone device as an embodiment of an audio output device or a noise reducing audio output device according to the present invention.

The embodiments of the noise reducing device to be described below have a configuration of a digital processing circuit. A noise reducing audio signal generating unit has a configuration of a digital filter. The filter coefficient of the noise reducing audio signal generating unit is switched and changed to thereby switch a noise reducing characteristic according to a plurality of different noise environments.

The noise reducing device according to an embodiment of the present invention can have a configuration of an analog processing circuit. In this case, however, it is necessary to provide each of filter circuits corresponding to a plurality of noise environments as a hardware circuit, and perform switching between the filter circuits. A configuration in which a plurality of filter circuits are thus provided and one of the plurality of filter circuits is selected by switching presents problems of an increase in scale of the hardware configuration and an increase in cost, and is thus not practical as a noise reducing system to be used for a portable device. Accordingly, the embodiments have a configuration of a digital processing circuit.

FIRST EMBODIMENT

Noise Reducing Device of Feedback System

The embodiments of the noise reducing device according to the present invention to be described below have a configuration of a system that performs active noise reduction. Active noise reduction systems include a feedback system (feedback type) and a feedforward system (feedforward type). The present invention can be applied to both noise reduction systems.

Figure 1:
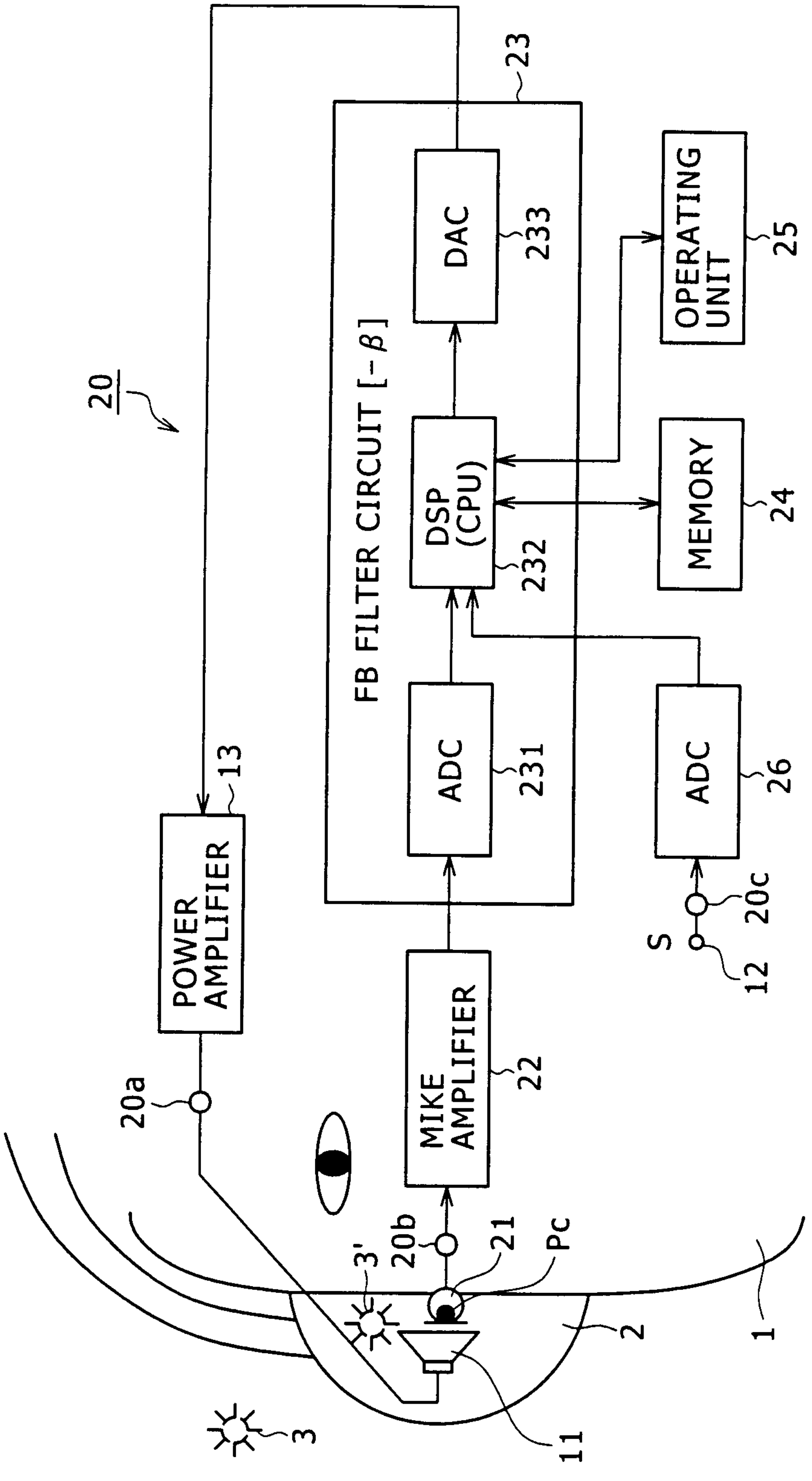
FIG. 1 is a block diagram showing an example of a headphone device to which a first embodiment of a noise reducing device according to the present invention is applied.

Description will first be made of an embodiment in which the noise reducing device according to the present invention is applied to a noise reducing system of a feedback type. FIG. 1 is a block diagram showing an example of configuration of an embodiment of a headphone device to which an embodiment of the noise reducing device according to the present invention is applied.

For simplicity of description, FIG. 1 shows the configuration of only a part of the headphone device for the right ear side of a listener 1. The same is true for embodiments to be described later. Incidentally, it is needless to say that a part for a left ear side is configured in the same manner.

FIG. 1 shows a state in which the listener 1 wears the headphone device according to the embodiment and thereby the right ear of the listener 1 is covered by a headphone casing (housing unit) 2 for the right ear. A headphone driver unit (hereinafter referred to simply as a driver) 11 as electric-to-acoustic converting means for acoustically reproducing an audio signal as an electric signal is provided inside the headphone casing 2.

An audio signal input terminal 12 is a terminal part to which an audio signal S to be listened to is input. This audio signal input terminal 12 is formed by a headphone plug to be inserted into a headphone jack of a portable music reproducing device. Provided in an audio signal transmission line between the audio signal input terminal 12 and the drivers 11 for the left ear and the right ear is a noise reducing device section 20 including not only a power amplifier 13 but also a microphone 21 as sound collecting means (acoustic-to-electric converting means), a microphone amplifier (hereinafter referred to simply as a mike amplifier) 22, a filter circuit 23 for noise reduction, a memory 24, an operating unit 25 and the like to be described later.

Though not shown in the figure, connections between the noise reducing device section 20 and the driver 11, the microphone 21, and the headphone plug forming the audio signal input terminal 12 are made by a connecting cable. References 20*a*, 20*b*, and 20*c* denote a connecting terminal part at which the connecting cables are connected to the noise reducing device section 20.

The first embodiment of FIG. 1 reduces noise coming from a noise source 3 outside the headphone casing 2 into a music listening position of the listener 1 within the headphone casing 2 in a music listening environment of the listener 1 by the feedback system, so that music can be listened to in a good environment.

In the noise reducing system of the feedback type, the microphone collects noise at an acoustic synthesis position (noise canceling point Pc) at which noise and the acoustically reproduced sound of a noise reducing audio signal are synthesized, the acoustic synthesis position being the music listening position of the listener 1.

Therefore, in the first embodiment, the microphone 21 for collecting noise is provided at the noise canceling point Pc inside the headphone casing (housing unit) 2. The position of the microphone 21 is a control point. Thus, in consideration of a noise attenuating effect, the noise canceling point Pc is normally disposed at a position close to the ear, that is, a position in front of the diaphragm of the driver 11. The microphone 21 is provided at this position.

An opposite phase component of the noise collected by the microphone is generated as a noise reducing audio signal by a noise reducing audio signal generating unit. The generated noise reducing audio signal is supplied to the driver 11 to be acoustically reproduced. Thereby the noise coming from the outside into the headphone casing 2 is reduced.

Noise at the noise source 3 and the noise 3' that has come into the headphone casing 2 do not have same characteristics. In the noise reducing system of the feedback type, however, the noise 3' that has come into the headphone casing 2, that is, the noise 3' to be reduced is collected by the microphone 21.

Thus, in the feedback system, it suffices for the noise reducing audio signal generating unit to generate the opposite phase component of the noise 3' so as to cancel the noise 3' collected at the noise canceling point Pc by the microphone 21.

The present embodiment uses the digital filter circuit 23 as the noise reducing audio signal generating unit of the feedback system. In the present embodiment, the noise reducing audio signal is generated by the feedback system, and therefore the digital filter circuit 23 will hereinafter be referred to as an FB filter circuit 23.

The FB filter circuit 23 includes a DSP (Digital Signal Processor) 232, an A/D converter circuit 231 provided in a stage preceding the DSP 232, and a D/A converter circuit 233 provided in a stage succeeding the DSP 232.

Figure 2:
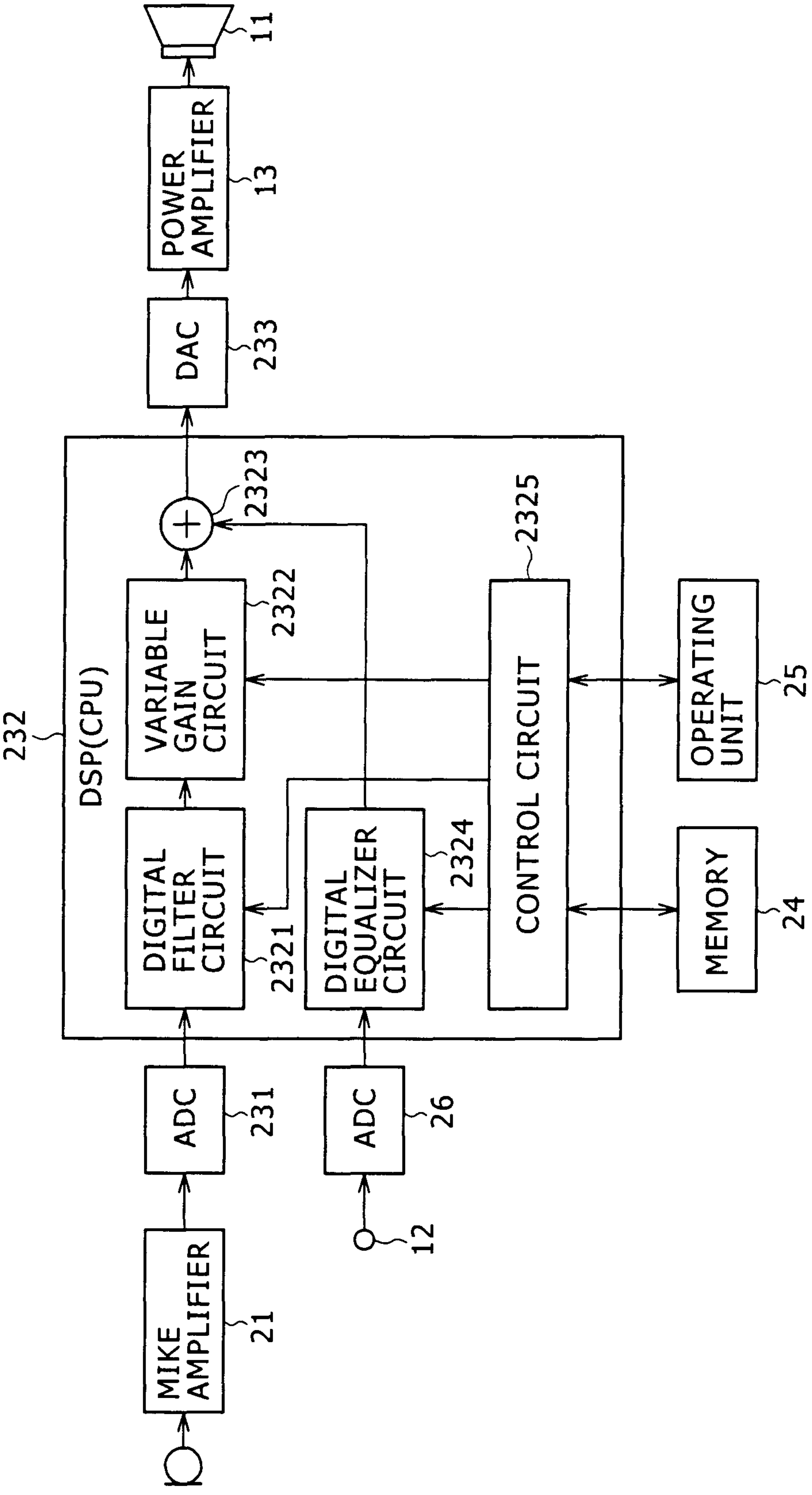
FIG. 2 is a block diagram showing an example of detailed configuration of a part of blocks in FIG. 1.

As shown in FIG. 2, the DSP 232 in the present embodiment includes a digital filter circuit 2321, a variable gain circuit 2322, an adder circuit 2323, a digital equalizer circuit 2324, and a control circuit 2325.

An analog audio signal obtained by collecting sound by the microphone 21 is supplied to the FB filter circuit 23 via the mike amplifier 22. The analog audio signal is converted into a digital audio signal by the A/D converter circuit 231. The digital audio signal is supplied to the digital filter circuit 2321 in the DSP 232.

The digital filter circuit 2321 in the DSP 232 is a digital filter for generating a digital noise reducing audio signal of the feedback system. The digital filter circuit 2321 generates the digital noise reducing audio signal having a characteristic corresponding to a filter coefficient as a parameter set in the digital filter circuit 2321 from the digital audio signal input to the digital filter circuit 2321. In the present embodiment, the filter coefficient set in the digital filter circuit 2321 is read from the memory 24 and supplied to the digital filter circuit 2321 by the control circuit 2325.

In the present embodiment, the memory 24 stores filter coefficients as a plurality of (plurality of sets of) parameters as later described so that noise in a plurality of various different noise environments can be reduced by the noise reducing audio signal of the feedback system which signal is generated by the digital filter circuit 2321 of the DSP 232.

The control circuit 2325 reads one particular filter coefficient (one particular set of filter coefficients) selected from among the plurality of filter coefficients from the memory 24, and sets the filter coefficient (the filter coefficient set) in the digital filter circuit 2321.

The control circuit 2325 in the present embodiment is supplied with an operating output signal of the operating unit 25. According to the operating output signal from the operating unit 25, the control circuit 2325 selects and reads one particular filter coefficient (one particular set of filter coefficients) from the memory 24, and sets the filter coefficient (the filter coefficient set) in the digital filter circuit 2321.

Incidentally, in the present embodiment, each filter coefficient set corresponding to a noise environment is set in the digital filter circuit 2321, whereby a noise canceling filter (hereinafter referred to as an NC filter) corresponding to each filter coefficient is formed to generate a corresponding noise reducing audio signal. Accordingly, in the following description, states in which respective NC filters corresponding to noise environments are set in the digital filter circuit 2321 will be referred to as noise modes, and names corresponding to the respective noise environments will be given to the respective noise modes, as later described. Hence, the switching and changing of a filter coefficient corresponds to the changing of a noise mode (which may be referred to simply as a mode).

The operating unit 25 in the present embodiment has a mode switching button for giving an instruction to switch the noise mode. In this example, a non-locking type push button switch is used as the mode switching button. In the present embodiment, each time a user presses the mode switching button of the operating unit 25, the noise mode is cyclically changed to a noise mode corresponding to a filter coefficient stored in the memory 24, as later described.

Then, the digital filter circuit 2321 of the DSP 232 generates a digital noise reducing audio signal corresponding to a filter coefficient selectively read from the memory 24 via the control circuit 2325 and set in the digital filter circuit 2321 as described above.

The digital noise reducing audio signal generated in the digital filter circuit 2321 is supplied through the variable gain circuit 2322 to the adder circuit 2323, as shown in FIG. 2. As will be described later, the variable gain circuit 2322 is subjected to control of the control circuit 2325 to be gain-controlled at a time of switching and changing the noise mode.

Meanwhile, an audio signal S (for example a music signal) to be listened to which signal has passed through the audio signal input terminal 12 is converted into a digital audio signal by an A/D converter circuit 26. The digital audio signal is thereafter supplied to the digital equalizer circuit 2324 to be subjected to sound quality correction such as an amplitude-frequency characteristic correction, a phase-frequency characteristic correction, or both of the amplitude-frequency characteristic correction and the phase-frequency characteristic correction for the audio signal S.

In the case of the noise reducing device of the feedback system, when a noise reducing curve (noise reducing characteristic) is changed by switching the filter coefficient of the digital filter circuit 2321, an effect corresponding to a frequency curve (frequency characteristic) having a noise reducing effect is produced on the externally input audio signal S to be listened to, and therefore an equalizer characteristic may need to be changed according to the change of the filter coefficient of the digital filter circuit 2321.

Accordingly, in the present embodiment, the memory 24 stores a parameter for changing the equalizer characteristic of the digital equalizer circuit 2324 in correspondence with each of the plurality of filter coefficients to be set in the digital filter circuit 2321. The control circuit 2325 supplies a parameter corresponding to a change of the filter coefficient to the digital equalizer circuit 2324 to thereby change the equalizer characteristic of the digital equalizer circuit 2324.

An output audio signal of the digital equalizer circuit 2324 is supplied to the adder circuit 2323 to be added to the noise reducing audio signal from the variable gain circuit 2322. Then, a resulting addition signal is supplied as an output of the DSP 232 to the D/A converter circuit 233 to be converted into an analog audio signal in the D/A converter circuit 233. This analog audio signal is then supplied as an output signal of the FB filter circuit 23 to the power amplifier 13. The audio signal from the power amplifier 13 is then supplied to the driver 11 to be acoustically reproduced, so that the reproduced sound of the audio signal is emitted to both the ears (only the right ear is shown in FIG. 1) of the listener 1.

The sound acoustically reproduced and emitted by the driver 11 includes an acoustically reproduced component based on the noise reducing audio signal generated in the FB filter circuit 23. The acoustically reproduced component based on the noise reducing audio signal, the acoustically reproduced component being included in the sound acoustically reproduced and emitted by the driver 11, and the noise 3' are acoustically synthesized, whereby the noise 3' is reduced (cancelled) at the noise canceling point Pc.

The noise reducing operation of the noise reducing device of the feedback system described above will be described using transfer functions with reference to FIG. 3.

Figure 3:
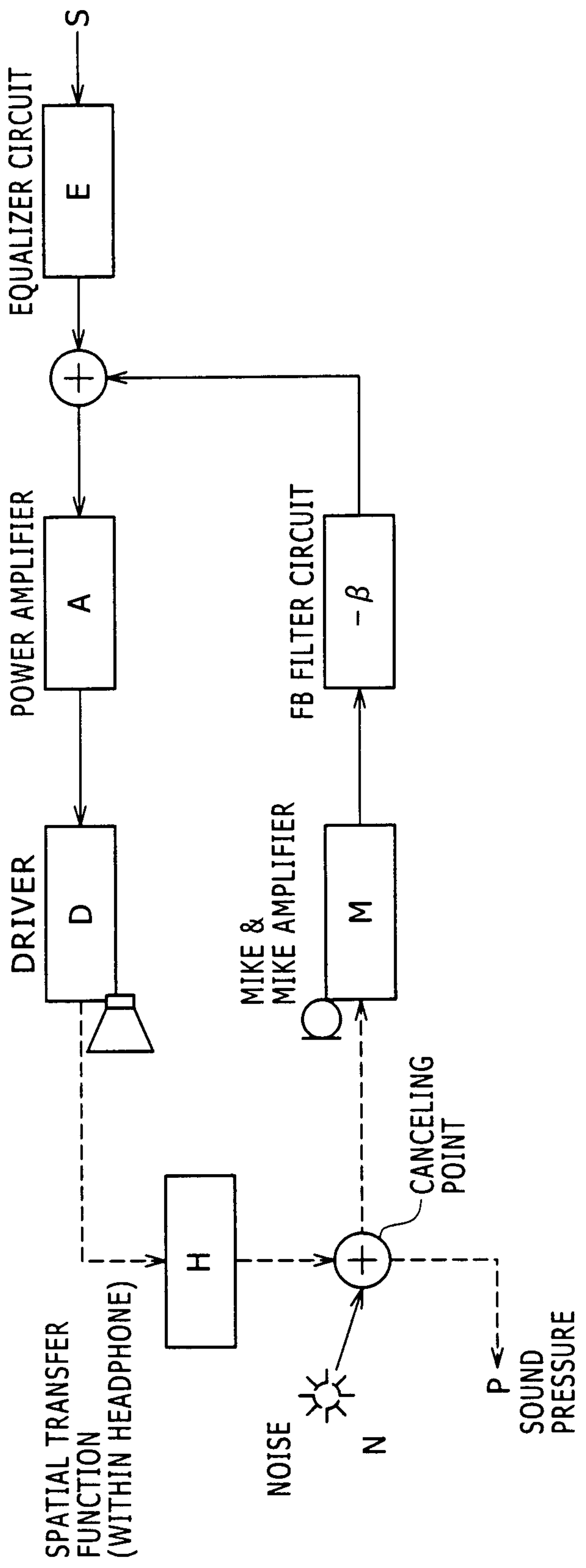
FIG. 3 is a diagram showing a configuration of the first embodiment of the noise reducing device according to the present invention using transfer functions.

FIG. 3 is a block diagram showing parts using transfer functions of the parts in correspondence with the block diagram of FIG. 1. In FIG. 3, A is the transfer function of the power amplifier 13, D is the transfer function of the driver 11, M is the transfer function corresponding to a part of the microphone 21 and the mike amplifier 22, and $-\beta$ is the transfer function of the filter designed for feedback (the digital filter circuit 2321). H is the transfer function of a space from the driver 11 to the microphone 21, and E is the transfer function of the equalizer circuit 2324 applied to the audio signal S to be listened to. Suppose that each of the above-described transfer functions is expressed by complex representation.

In FIG. 3, N is the noise entering the vicinity of the position of the microphone 21 within the headphone casing 2 from the external noise source, and P is sound pressure reaching the ear of the listener 1. Incidentally, the external noise is transmitted to the inside of the headphone casing 2 because the noise leaks as a sound pressure from a crack of an ear pad portion, for example, or the headphone casing 2 is subjected to a sound pressure and thereby vibrates, resulting in the sound being transmitted to the inside of the headphone casing 2, for example.

When represented as in FIG. 3, the blocks of FIG. 3 can be expressed by (Equation 1) in FIG. 4. Directing attention to noise N in (Equation 1), it is shown that the noise N is attenuated to 1/(1+ADHMβ). However, for the system of (Equation 1) to operate stably as a noise canceling mechanism in a frequency band as an object for noise reduction, (Equation 2) in FIG. 4 may need to hold.

Generally, in combination with the absolute value of a product of transfer functions in the noise reducing system of the feedback type being more than one (1<<|ADHMβ|), and with Nyquist's stability criterion in a classic control theory, the stability of the system regarding (Equation 2) in FIG. 4 can be interpreted as follows.

Consideration will be given to an "open loop" of the transfer functions (−ADHMβ), the open loop being formed by disconnecting one part in a loop part (loop part from the microphone 21 to the driver 11) related to the noise N in FIG. 3. This open loop has characteristics represented in a Bode diagram of FIG. 5.

Figure 5:
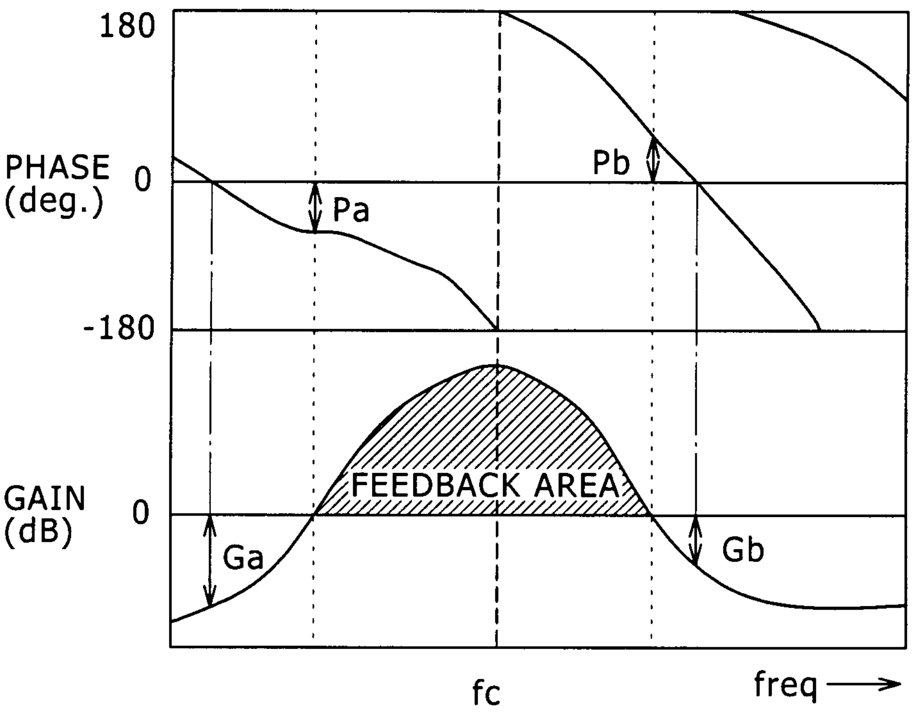
FIG. 5 is a diagram of assistance in explaining the first embodiment of the noise reducing device according to the present invention.

When this open loop is considered, from Nyquist's stability criterion, the following two conditions need to be met in FIG. 5 in order for the above-described (Equation 2) to hold.

Gain should be lower than 0 dB when a point of a phase of 0 deg. is passed.

A point of a phase of 0 deg. should not be included when the gain is 0 dB or higher.

When the two conditions are not met, positive feedback is effected in the loop, and oscillation (howling) is caused. In FIG. 5, Pa and Pb denote a phase margin, and Ga and Gb denote a gain margin. When these margins are small, the risk of oscillation is increased depending on individual difference and variations in the wearing of the headphone.

Description will next be made of a case of reproducing necessary sound from the driver of the headphone in addition to the above-described noise reducing function.

The audio signal S to be listened to in FIG. 3 is a generic name for signals to be primarily reproduced from the driver of the headphone, which signals actually include not only a music signal but also sound of a microphone outside the casing (use as a hearing aid function), an audio signal via a communication (use as a headset), and the like.

Directing attention to the signal S in the above-described (Equation 1), when the equalizer E is set as in (Equation 3) shown in FIG. 4, the sound pressure P is expressed as in (Equation 4) in FIG. 4.

Thus, supposing that the position of the microphone 21 is very close to the position of the ear, because H is the transfer function from the driver 11 to the microphone 21 (ear), and A and D are the transfer functions of the characteristics of the power amplifier 13 and the driver 11, respectively, it is shown that a characteristic similar to that of an ordinary headphone without a noise reducing function is obtained. Incidentally, at this time, the transfer characteristic E of the equalizer circuit 13 is substantially equal to the open loop characteristic as viewed on a frequency axis.

As described above, with the headphone device of the configuration in FIG. 1, the audio signal to be listened to can be listened to without any problem while noise is reduced. In this case, however, to obtain a sufficient noise reduction effect may require that a filter coefficient corresponding to the characteristic of noise transmitted from the external noise source 3 to the inside of the headphone casing 2 be set in the digital filter formed in the DSP 232.

As described above, there are various noise environments in which noise occurs, and the frequency characteristics and the phase characteristics of the noise correspond to the respective noise environments. Therefore a sufficient noise reduction effect cannot be expected to be obtained with a single filter coefficient in all the noise environments.

Accordingly, in the present embodiment, as described above, a plurality of (a plurality of sets of) filter coefficients corresponding to the various noise environments are prepared by being stored in advance in the memory 24. A filter coefficient considered to be appropriate is selected and read from the plurality of filter coefficients, and then set in the digital filter circuit 2321 formed in the DSP 232 of the FB filter circuit 23.

It is desirable that noise be collected in each of the various noise environments and an appropriate filter coefficient to be set in the digital filter 2321 which filter coefficient can reduce (cancel) the noise be calculated and stored in the memory 24 in advance. For example, noise is collected in various noise environments such as a platform in a railway station, an airport, the inside of a train running on the ground, the inside of a subway train, the bustle of town, the inside of a large store, and the like. Appropriate filter coefficients that can reduce (cancel) the noise are calculated and stored in the memory 24 in advance.

That is, a set of filter coefficients corresponding to each of a plurality of noise environments, that is, each of a plurality of noise modes is calculated and stored in the memory 24 in advance.

In the first embodiment, a user manually selects an appropriate filter coefficient from the plurality of (plurality of sets of) filter coefficients stored in the memory 24. Thus, the operating unit 25 operated by the user is connected to the control circuit 2325 in the DSP 232.

As described above, the operating unit 25 in the present embodiment has for example a mode switching button formed by a non-locking type push button switch as filter coefficient changing operating means (noise mode switching and changing means). Each time the listener presses the mode switching button, the control circuit 2325 changes a filter coefficient set read from the memory 24, and supplies the changed filter coefficient set to the digital filter circuit 2321.

Figure 6:
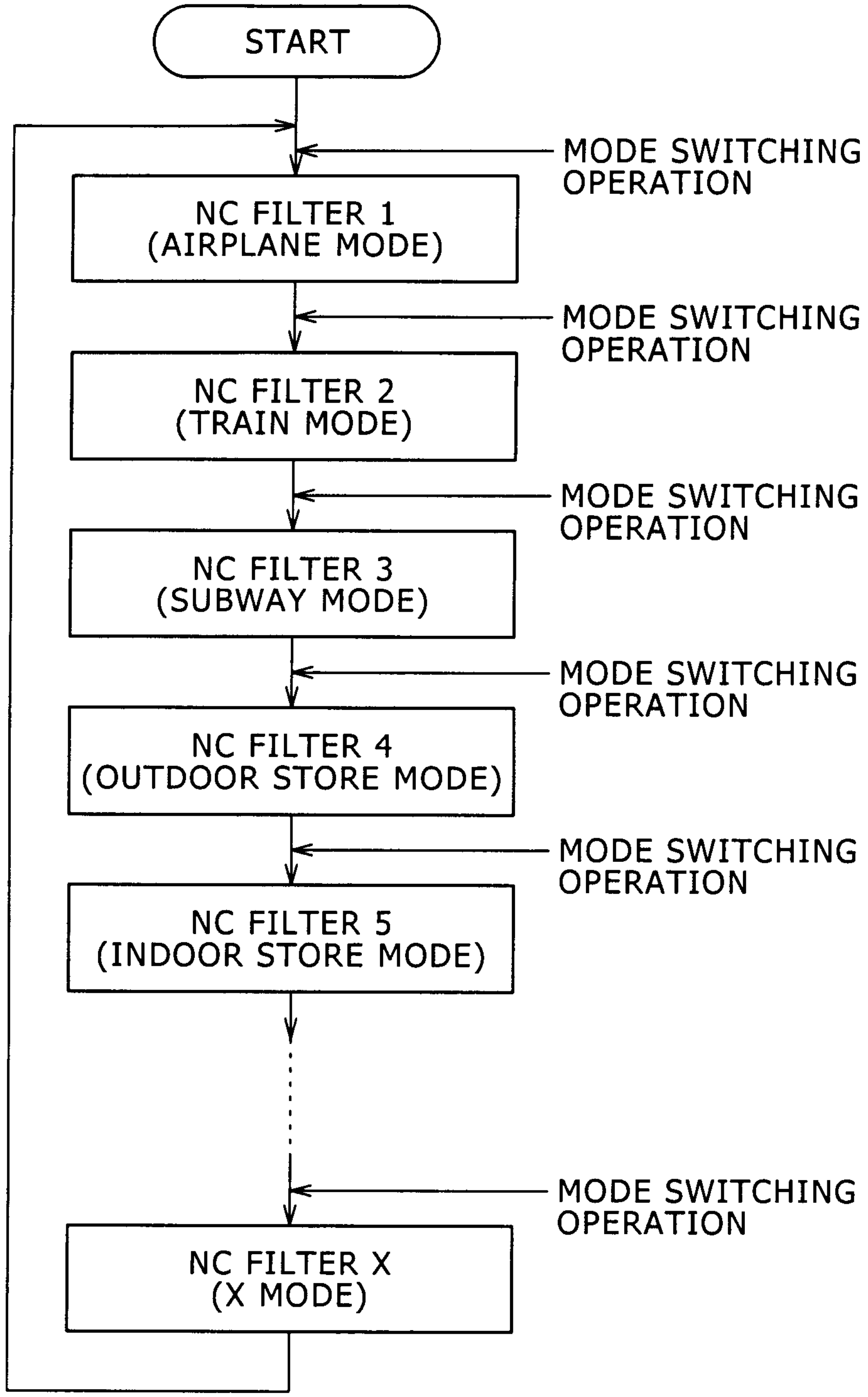
FIG. 6 is a diagram of assistance in explaining operation of principal parts in the first embodiment of the noise reducing device according to the present invention.

That is, as shown in FIG. 6, each time the control circuit 2325 detects a mode switching operation by the pressing of the mode switching button, the control circuit 2325 changes a filter coefficient read from the memory 24 and supplied to the digital filter circuit 2321, and thereby switches and changes the filter characteristic of an NC filter formed by the digital filter circuit 2321.

In this case, for readout of a plurality of (a plurality of sets of) filter coefficients corresponding to a plurality of noise modes, the filter coefficients being stored in the memory 24, the control circuit 2325 determines a readout sequence in order of the noise modes. When the control circuit 2325 determines that an operating instruction to switch and change the noise mode is given, the control circuit 2325 reads and changes the plurality of filter coefficients in order and cyclically according to the readout sequence.

In the case of FIG. 6, for example, a first noise mode is set as an airplane mode (a mode of a noise environment inside an airplane), a second noise mode is set as a train mode (a mode of a noise environment inside a train), a third noise mode is set as a subway mode (a mode of a noise environment inside a subway train), a fourth noise mode is set as an outdoor store mode (a mode of a noise environment outside a store), a fifth noise mode is set as an indoor store mode (a mode of a noise environment inside a store), . . . . An NC filter 1, an NC filter 2, an NC filter 3, an NC filter 4, an NC filter 5, . . . corresponding to the respective noise modes are formed by the digital filter circuit 2321 in the respective noise modes.

Figure 7:
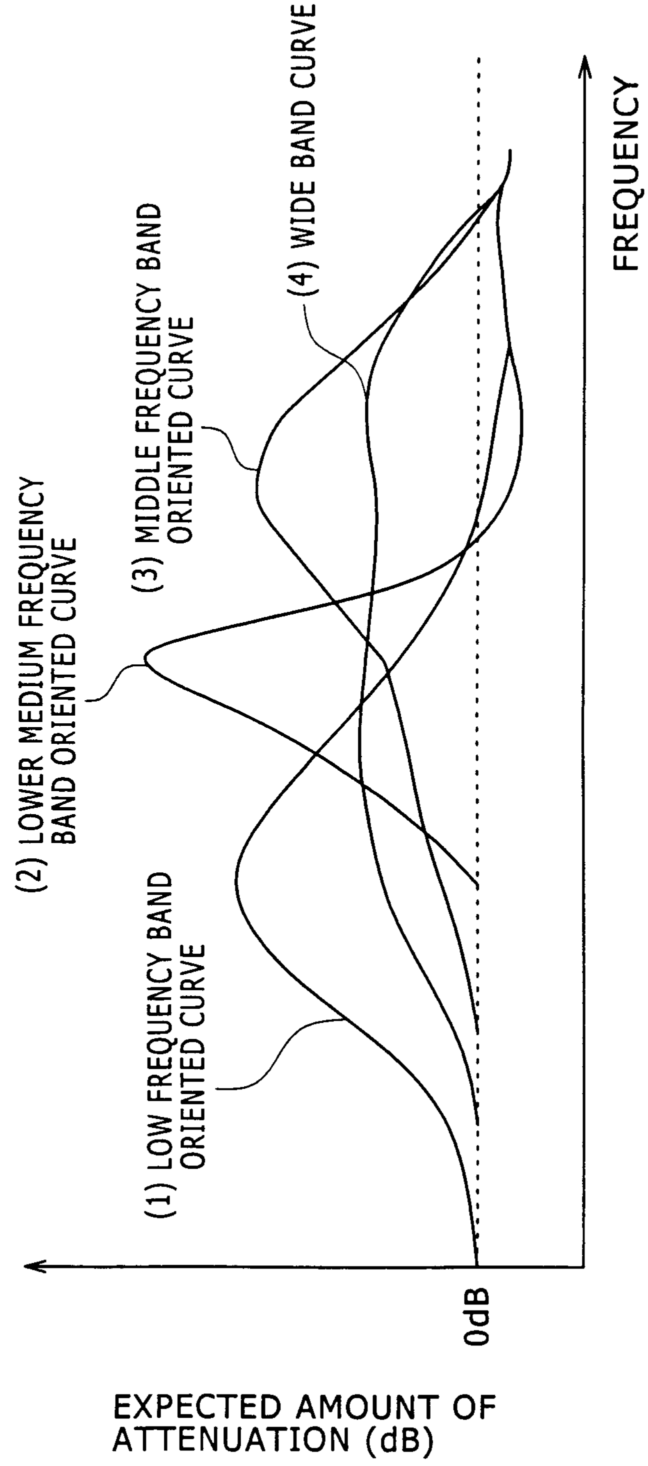
FIG. 7 is a diagram of assistance in explaining operation of principal parts in the first embodiment of the noise reducing device according to the present invention.

For example, suppose that, as a simple example, sets of parameters, that is, sets of filter coefficients that can provide four kinds of noise reduction effects as represented by "noise attenuating curves (noise attenuating characteristics)" shown in FIG. 7 are written in the memory 24. In the example of FIG. 7, for four kinds of noise modes of noise characteristics in cases where noise is distributed mainly in a low-frequency band, a lower-medium-frequency band, a medium-frequency band, and a wide band, respectively, the filter coefficient set that provides a curve characteristic for reducing the noise in each of the noise modes is stored in the memory 24.

In this case, suppose that the filter coefficient providing a noise reducing characteristic of a low frequency band oriented curve for reducing the noise distributed mainly in the low-frequency band as shown in FIG. 7 is a first filter coefficient, that the filter coefficient providing a noise reducing characteristic of a lower medium frequency band oriented curve for reducing the noise distributed mainly in the lower-medium-frequency band as shown in FIG. 7 is a second filter coefficient, that the filter coefficient providing a noise reducing characteristic of a medium frequency band oriented curve for reducing the noise distributed mainly in the medium-frequency band as shown in FIG. 7 is a third filter coefficient, and that the filter coefficient providing a noise reducing characteristic of a wide band oriented curve for reducing the noise distributed in the wide band as shown in FIG. 7 is a fourth filter coefficient. Then, each time the push switch is pressed to give an operating instruction to change the filter coefficient, the filter coefficient read from the memory 24 is changed from the first filter coefficient to the second filter coefficient to the third filter coefficient to the fourth filter coefficient to the first filter coefficient . . . , for example.

Thus switching and changing the noise mode, the listener 1 checks the noise reduction effect in each noise mode with his/her own ears. In a noise mode in which the filter coefficient with which the listener 1 feels that a sufficient noise reduction effect is obtained is read, the listener 1 thereafter stops pressing the mode switching button. Then, the control circuit 2325 thereafter continues reading the filter coefficient read at this time, and is controlled to be in a state of reading the filter coefficient of the noise mode selected by the user.

Incidentally, the above-described example of FIG. 7 corresponds to a case where states in which noise is distributed mainly in four kinds of bands, that is, a low-frequency band, a lower-medium-frequency band, a medium-frequency band, and a wide band are assumed, filter coefficients are set so as to provide curve characteristics for reducing the noise in the respective states, and then the filter coefficients are stored in the memory 24, rather than a case where noise in each noise environment is actually measured and then the filter coefficient corresponding thereto is set, as described above.

Even with the filter coefficients set in correspondence with such simple noise modes, the noise reducing device according to the present embodiment can select a filter coefficient suitable for each noise environment. Therefore a better noise reduction effect can be obtained than in a case where the filter coefficient is set fixedly as in the conventional analog filter system.

In this case, in order for the listener to check more surely the noise reduction effect in each noise mode at a time of switching and changing noise modes, the control circuit 2325 in the present embodiment performs the following control at the mode switching and changing time.

FIRST EXAMPLE

Figure 8:
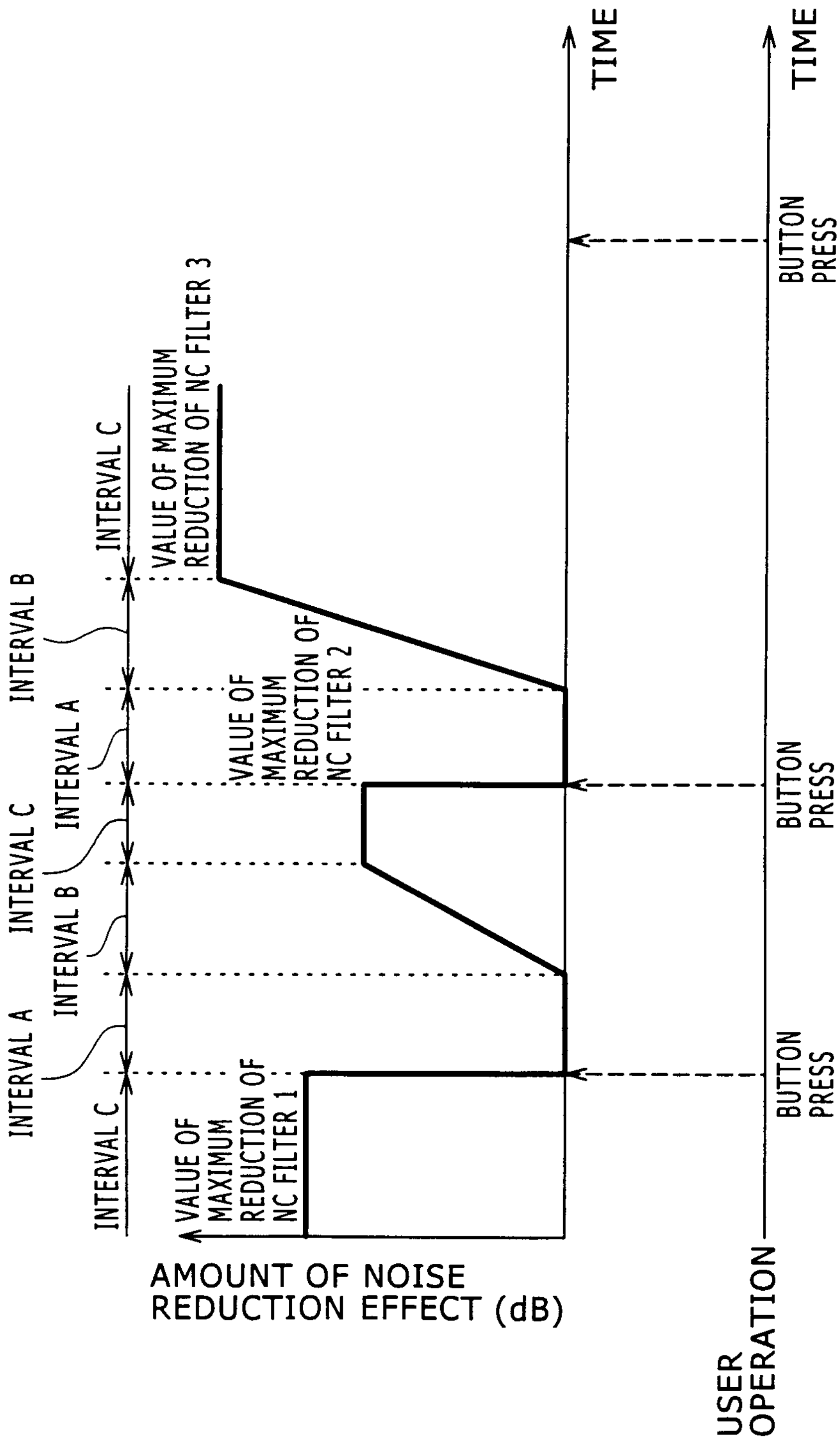
FIG. 8 is a diagram of assistance in explaining operation of principal parts in the first embodiment of the noise reducing device according to the present invention.

FIG. 8 is a diagram of assistance in explaining a first example of the control of the control circuit 2325 at the mode switching and changing time in the present embodiment.

In this example, when determining that an operation of pressing the mode switching button is performed, the control circuit 2325 not only changes filter coefficients and switches NC filters formed in the digital filter circuit 2321, but also provides a noise reduction effect off interval A immediately after the operation of pressing the mode switching button is performed, the noise reduction effect off interval A being a predetermined time during which the noise reduction effect of the digital filter circuit 2321 is reduced to zero and thus the noise reduction effect is practically turned off, as shown in FIG. 8.

Then, the control circuit 2325 provides a noise reduction effect gradual increase interval B after the noise reduction effect off interval A is ended, the noise reduction effect gradual increase interval B being a predetermined time during which the noise reduction effect of the NC filter in a noise mode after the switching is gradually increased to a maximum value of the noise reduction effect.

After the noise reduction effect gradual increase interval B is ended, the control circuit 2325 fixes the noise reduction effect of the NC filter in the noise mode after the switching at the maximum value of the noise reduction effect. In FIG. 8, an interval during which the noise reduction effect is fixed at the maximum value is shown as an interval C.

The interval lengths (time lengths) of the noise reduction effect off interval A and the noise reduction effect gradual increase interval B are each set to a proper length. For example, the interval A is set to a period of three seconds, and the interval B is set to a period of four seconds. The interval C is not constant, with a point in time when the operation of pressing the mode switching button is performed next being an end point of the interval C.

Incidentally, in the present embodiment, while the noise reduction effect gradual increase interval B is a fixed time, the maximum value of an amount of noise reduction of the NC filter in each noise mode is not the same. Therefore the slope of the gradual increase in noise reduction effect differs depending on the maximum value of the amount of noise reduction of the NC filter in each noise mode.

Figure 9:
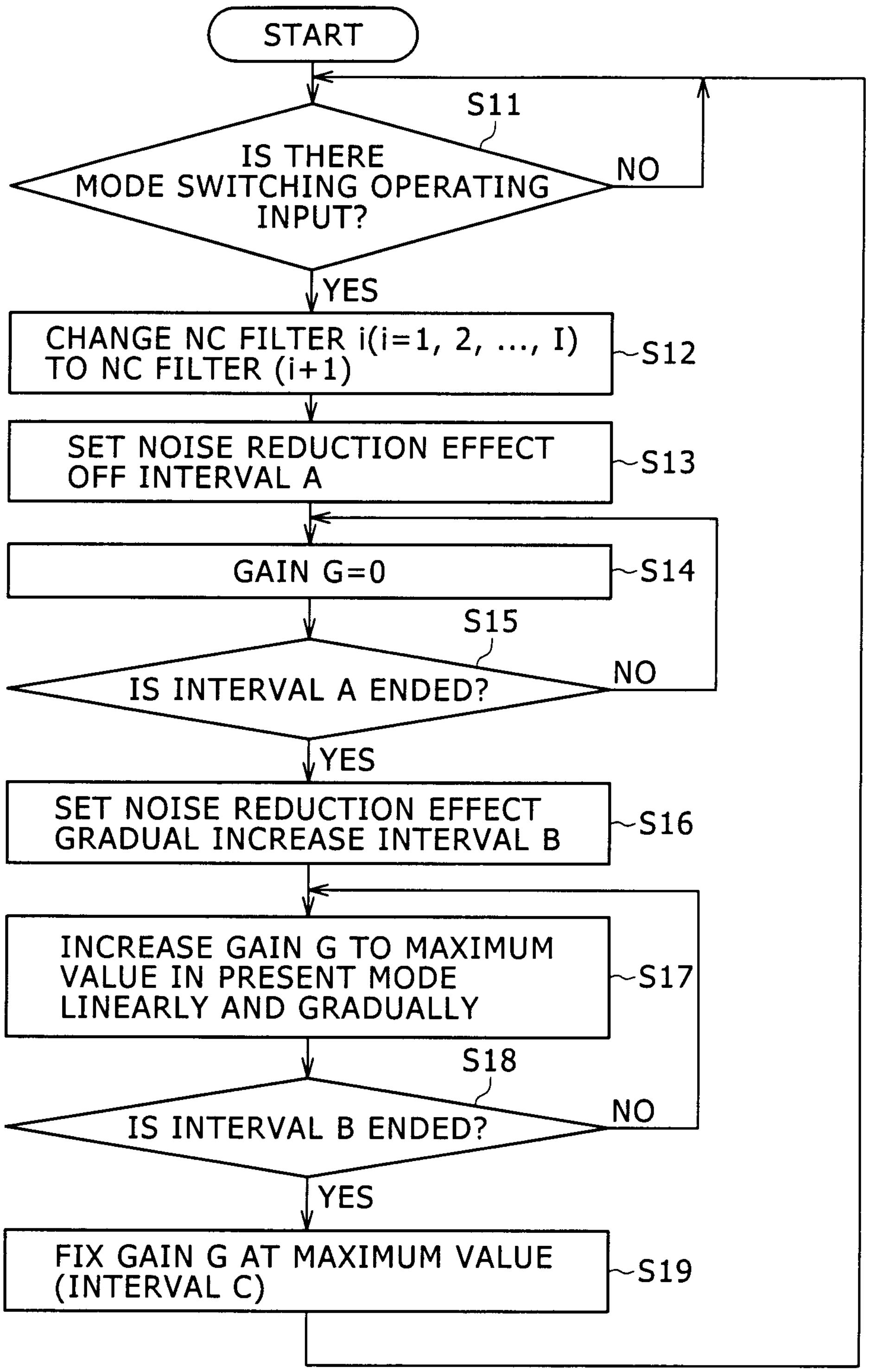
FIG. 9 is a flowchart of assistance in explaining operation of principal parts in the first embodiment of the noise reducing device according to the present invention.

FIG. 9 is a flowchart of the control of the control circuit 2325 in the first example. The control circuit 2325 monitors for an operating signal from the operating unit 25 to determine whether the mode switching button is pressed to give an operating instruction to switch and change the noise mode (step S11).

When determining in step S11 that no operating instruction to switch and change the noise mode is given, the control circuit 2325 repeats step S11, and thus waits for the operating instruction to switch and change the noise mode.

When determining in step S11 that the operating instruction to switch and change the noise mode is given, the control circuit 2325 changes the filter coefficient set read from the memory 24 to a filter coefficient of a next NC filter which filter coefficient is different from the filter coefficient thus far, and then supplies the filter coefficient of the next NC filter to the digital filter circuit 2321 (step S12).

Next, the control circuit 2325 sets the noise reduction effect off interval A in a temporal timer (step S13), and controls the gain G of the variable gain circuit 2322 to zero (step S14).

Then, the control circuit 2325 monitors the temporal timer to determine whether the noise reduction effect off interval A is ended (step S15). When the noise reduction effect off interval A is not ended, the control circuit 2325 returns to step S14 to maintain the state in which the gain G of the variable gain circuit 2322 is zero.

When determining in step S15 that the noise reduction effect off interval A is ended, the control circuit 2325 sets a noise reduction effect gradual increase interval B in the temporal timer (step S16). The control circuit 2325 increases the gain G of the variable gain circuit 2322 linearly and gradually on a dB axis until a maximum amount of noise reduction of the NC filter in the noise mode is reached in the noise reduction effect gradual increase interval B (step S17).

Then, the control circuit 2325 monitors the temporal timer to determine whether the noise reduction effect gradual increase interval B is ended (step S18). When the noise reduction effect gradual increase interval B is not ended, the control circuit 2325 returns to step S16 to continue increasing the gain G of the variable gain circuit 2322 gradually.

When determining in step S18 that the noise reduction effect gradual increase interval B is ended, the control circuit 2325 fixes the gain G of the variable gain circuit 2322 to the state of the maximum amount of reduction of the NC filter in the noise mode (step S19). Then the control circuit 2325 returns to step S11. The above operation is repeated each time the operation of pressing the mode switching button is performed.

Though no reference has been made in the above description, in the case of the noise reduction processing of the feedback system in the present embodiment, the equalizer characteristic for the audio signal S may need to be changed in response to the changing of the noise reduction effect. The control circuit 2325 controls the equalizer characteristic of the digital equalizer circuit 2324 according to the gain control for the noise reduction effect in each of the noise reduction effect off interval A and the noise reduction effect gradual increase interval B.

Figure 10:
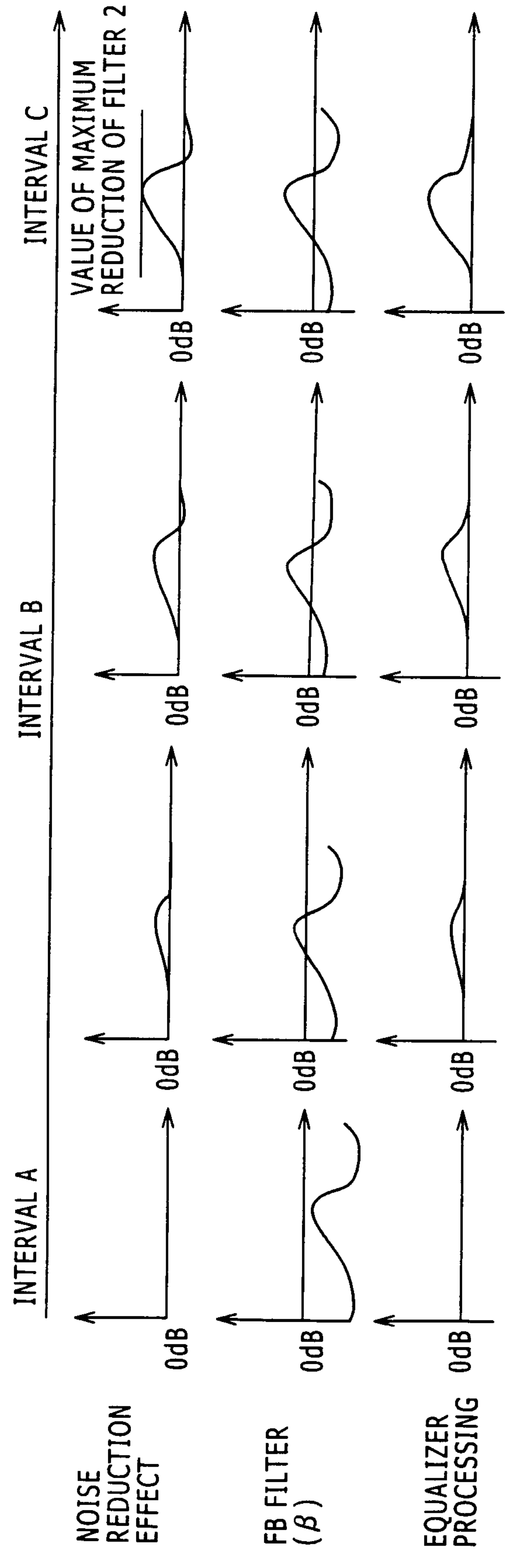
FIG. 10 is a diagram of assistance in explaining operation of principal parts in the first embodiment of the noise reducing device according to the present invention.

FIG. 10 shows an example of changes in the noise reduction effect, the NC filter characteristic in the digital filter circuit 2321, and the equalizer characteristic of the digital equalizer circuit 2324 in the noise reduction effect off interval A, the noise reduction effect gradual increase interval B, and the interval C.

SECOND EXAMPLE

In this second example, the control at the time of switching and changing the noise mode which control is based on the operation of pressing the mode switching button as in the first example is performed, and at the same time, when the operation of pressing the mode switching button is performed, a noise mode after the mode switching change is notified to the user. Thereby the user can recognize the noise mode close to a noise environment in which the user is located in advance, and check the noise reduction effect.

In this case, for the notification of the noise mode, the second example uses for example a method of adding a voice message notifying each noise mode to the audio signal supplied to the driver 11. For example, a notifying voice message such as "airplane" or the like is used when a next noise mode set by a switching change is the airplane mode, a notifying voice message such as "train" or the like is used when a next noise mode set by a switching change is the train mode, and a notifying voice message such as "subway" or the like is used when a next noise mode set by a switching change is the subway mode.

In the second example, though not shown in the figure, the notifying voice message for each noise mode is for example stored in the memory 24. The control circuit 2325 reads the notifying voice message in appropriate timing based on the operation of pressing the mode switching button, and supplies the notifying voice message to the adder circuit 2323.

In the second example, the timing of adding the notifying voice message for each noise mode to the adder circuit 2323 is selected such that the notifying voice message is added to the adder circuit 2323 in a state in which the noise reduction effect is at a maximum, that is, in a state in which noise is reduced and thus the voice is easily heard.

Figure 11:
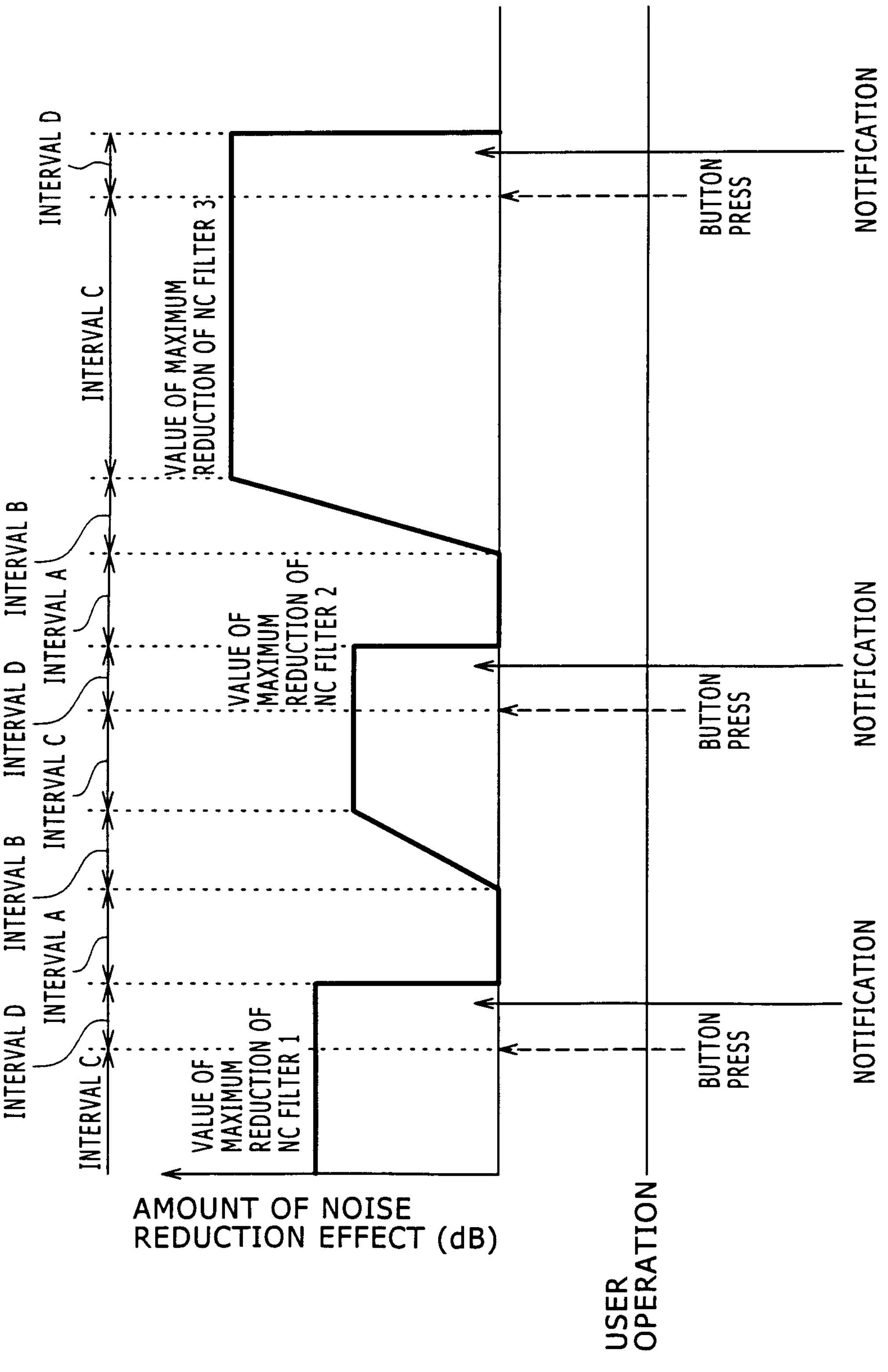
FIG. 11 is a diagram of assistance in explaining another example of operation of the principal parts in the first embodiment of the noise reducing device according to the present invention.

FIG. 11 is a diagram of assistance in explaining the second example of the control of the control circuit 2325 at a mode switching and changing time in the present embodiment.

As shown in FIG. 11, rather than immediately changing to the noise reduction effect off interval A when the operation of pressing the mode switching button is performed, the second example has an interval D in which the interval C, during which the noise reduction effect of an NC filter in a mode before the operation of pressing the mode switching button is at a maximum, is extended by a predetermined time after the operation of pressing the mode switching button. This interval D is set as a next mode notifying interval.

In this notifying interval D, the control circuit 2325 reads a next mode notifying message from the memory 24 to add the next mode notifying message to the audio signal in the adder circuit 2323. Then, after the notifying interval D is ended, a transition is made to the above-described noise reduction effect off interval A.

Figure 12:
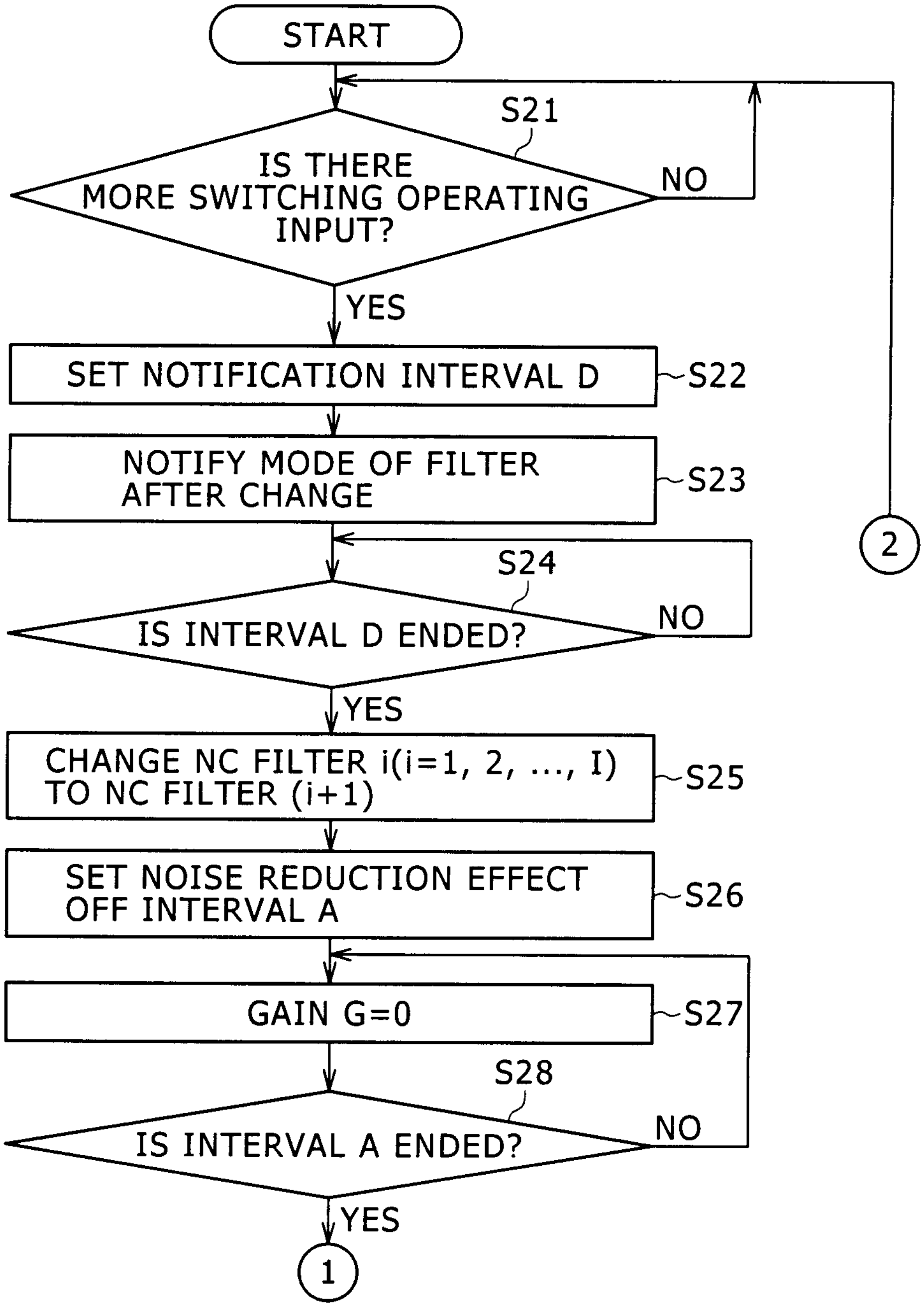
FIG. 12 is a part of a flowchart of assistance in explaining the other example of operation of the principal parts in the embodiment of the noise reducing device according to the present invention.
Figure 13:
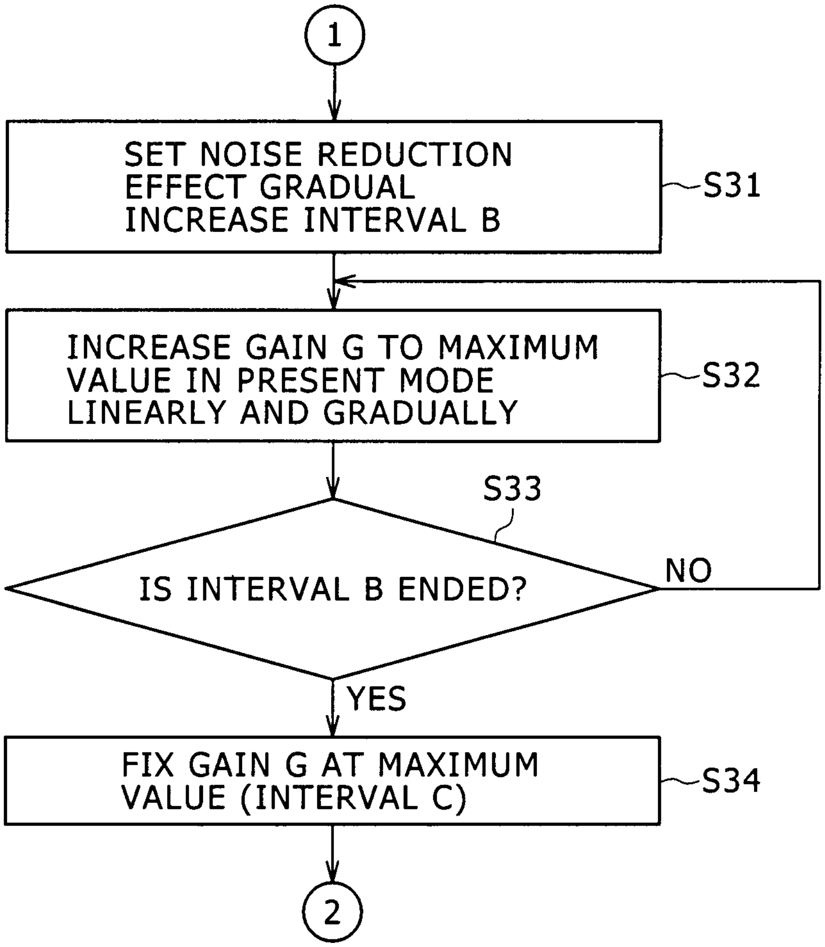
FIG. 13 is a part of the flowchart of assistance in explaining the other example of operation of the principal parts in the embodiment of the noise reducing device according to the present invention.

FIG. 12 and FIG. 13 continued from FIG. 12 are flowcharts of the control of the control circuit 2325 in the second example. The control circuit 2325 monitors for an operating signal from the operating unit 25 to determine whether the mode switching button is pressed to give an operating instruction to switch and change the noise mode (step S21).

When determining in step S21 that no operating instruction to switch and change the noise mode is given, the control circuit 2325 repeats step S21, and thus waits for the operating instruction to switch and change the noise mode.

When determining in step S21 that the operating instruction to switch and change the noise mode is given, the control circuit 2325 sets the notifying interval D in the temporal timer (step S22). Then, the control circuit 2325 reads data of a notifying voice message for a next noise mode from the memory 24, and supplies the data to the adder circuit 2323 to thereby notify the user of the next noise mode (step S23).

Then, the control circuit 2325 monitors the temporal timer to determine whether the notifying interval D is ended (step S24). When the notifying interval D is not ended, the control circuit 2325 returns to step S24 and waits for an end of the notifying interval D.

When determining in step S24 that the notifying interval D is ended, the control circuit 2325 changes a filter coefficient set read from the memory 24 to a filter coefficient of a next NC filter which filter coefficient is different from the filter coefficient thus far, and then supplies the filter coefficient of the next NC filter to the digital filter circuit 2321 (step S25).

Next, the control circuit 2325 sets the noise reduction effect off interval A in the temporal timer (step S26), and controls the gain G of the variable gain circuit 2322 to zero (step S27). Then, the control circuit 2325 monitors the temporal timer to determine whether the noise reduction effect off interval A is ended (step S28). When the noise reduction effect off interval A is not ended, the control circuit 2325 returns to step S27 to maintain the state in which the gain G of the variable gain circuit 2322 is zero.

Next, when determining in step S28 that the noise reduction effect off interval A is ended, the control circuit 2325 sets a noise reduction effect gradual increase interval B in the temporal timer (step S31 in FIG. 13). The control circuit 2325 increases the gain G of the variable gain circuit 2322 linearly and gradually on a dB axis until a maximum amount of noise reduction of the NC filter in the noise mode is reached in the noise reduction effect gradual increase interval B (step S32).

Then, the control circuit 2325 monitors the temporal timer to determine whether the noise reduction effect gradual increase interval B is ended (step S33). When the noise reduction effect gradual increase interval B is not ended, the control circuit 2325 returns to step S32 to continue increasing the gain G of the variable gain circuit 2322 gradually.

When determining in step S33 that the noise reduction effect gradual increase interval B is ended, the control circuit 2325 fixes the gain G of the variable gain circuit 2322 to the state of the maximum amount of reduction of the NC filter in the noise mode (step S34). Then the control circuit 2325 returns to step S21. The above operation is repeated each time the operation of pressing the mode switching button is performed.

THIRD EXAMPLE

In the first example and the second example described above, at the time of switching and changing the noise mode, the noise reduction effect of the NC filter in the noise mode before the switching change is immediately changed from the state of the maximum amount of noise reduction to the state of the amount of noise reduction being zero. In this third example, the noise reduction effect of the NC filter in the noise mode before the switching change is gradually changed from the state of the maximum amount of noise reduction to the state of the amount of noise reduction being zero. This is to prevent the noise reduction effect from ceasing suddenly and thereby offending the ear of the listener.

Figure 14:
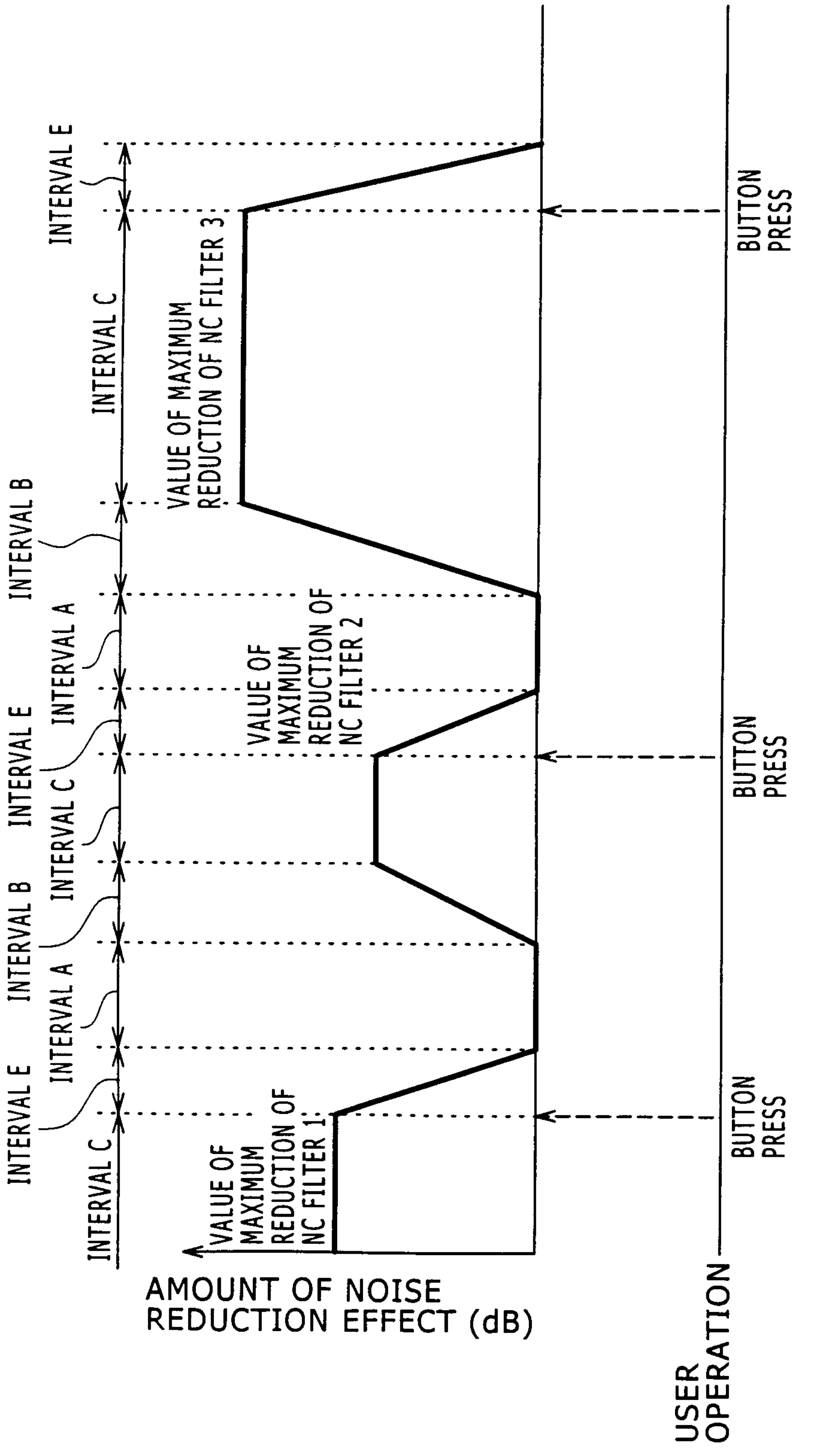
FIG. 14 is a diagram of assistance in explaining yet another example of operation of the principal parts in the first embodiment of the noise reducing device according to the present invention.

FIG. 14 shows a case where the third example is applied to the first example, in which case a noise reduction effect gradual decrease interval E is provided after the interval C. When the noise reduction effect gradual decrease interval E is ended, a transition is made to the noise reduction effect off interval A.

Incidentally, when the third example is applied to the second example, the noise reduction effect gradual decrease interval E is provided after the interval D. When the noise reduction effect gradual decrease interval E is ended, a transition is made to the noise reduction effect off interval A.

Incidentally, while the noise reduction effect gradual increase interval B is a fixed time in the above description of the first to third examples, the interval B may be made variable, so that the slope of the gradual increase in noise reduction effect is the same at all times and the amount of noise reduction is gradually increased to the maximum value of the amount of noise reduction of an NC filter after a mode switching change.

In addition, while the notifying interval D is also set to a predetermined time in the second example, the notifying interval D may be ended when the addition of a notifying voice message is completed, and a transition may be made to the noise reduction effect off interval A immediately.

Further, in the above-described examples, the noise reduction effect during the noise reduction effect gradual increase interval B is gradually increased by controlling the gain G of the variable gain circuit 2322. However, the gradual increase in noise reduction effect can also be realized by storing, in the memory 24, a set of filter coefficients changing so as to realize the gradual increase in noise reduction effect during the noise reduction effect gradual increase interval B as a filter coefficient for an NC filter in each noise mode and sequentially reading the filter coefficient sets during the noise reduction effect gradual increase interval B.

Incidentally, while a next noise mode is clearly notified to the user in the above example, simply a noise mode switching change may be notified to the user. In this case, a particular sound, for example a beep sound, rather than a voice message, may be used for the notification.

In addition, a next noise mode may be notified by using a sound corresponding to the noise mode, for example an associated sound such as an information announcement in an airport, an information announcement on a platform in a railway station, or the like rather than a notifying voice message.

Incidentally, for the listener to check the noise reduction effect more surely, it may be better for the listener to check the noise reduction effect in an environment in which reproduced sound based on the audio signal S is not emitted from the driver 11. Methods adoptable to deal with such a case include a method of allowing the listener to check the noise reduction effect while operating the operating unit 25 in an environment in which the audio signal S is not input and a method of muting the audio signal S supplied to the DSP 232 for a predetermined time, which is more or less sufficient to check the noise reduction effect, from the operation of pressing the mode switching button of the operating unit 25 when the audio signal S is being input and reproduced. This is true for embodiments to be described later.

SECOND EMBODIMENT

Noise Reducing Device of Feedforward Type

Figure 15:
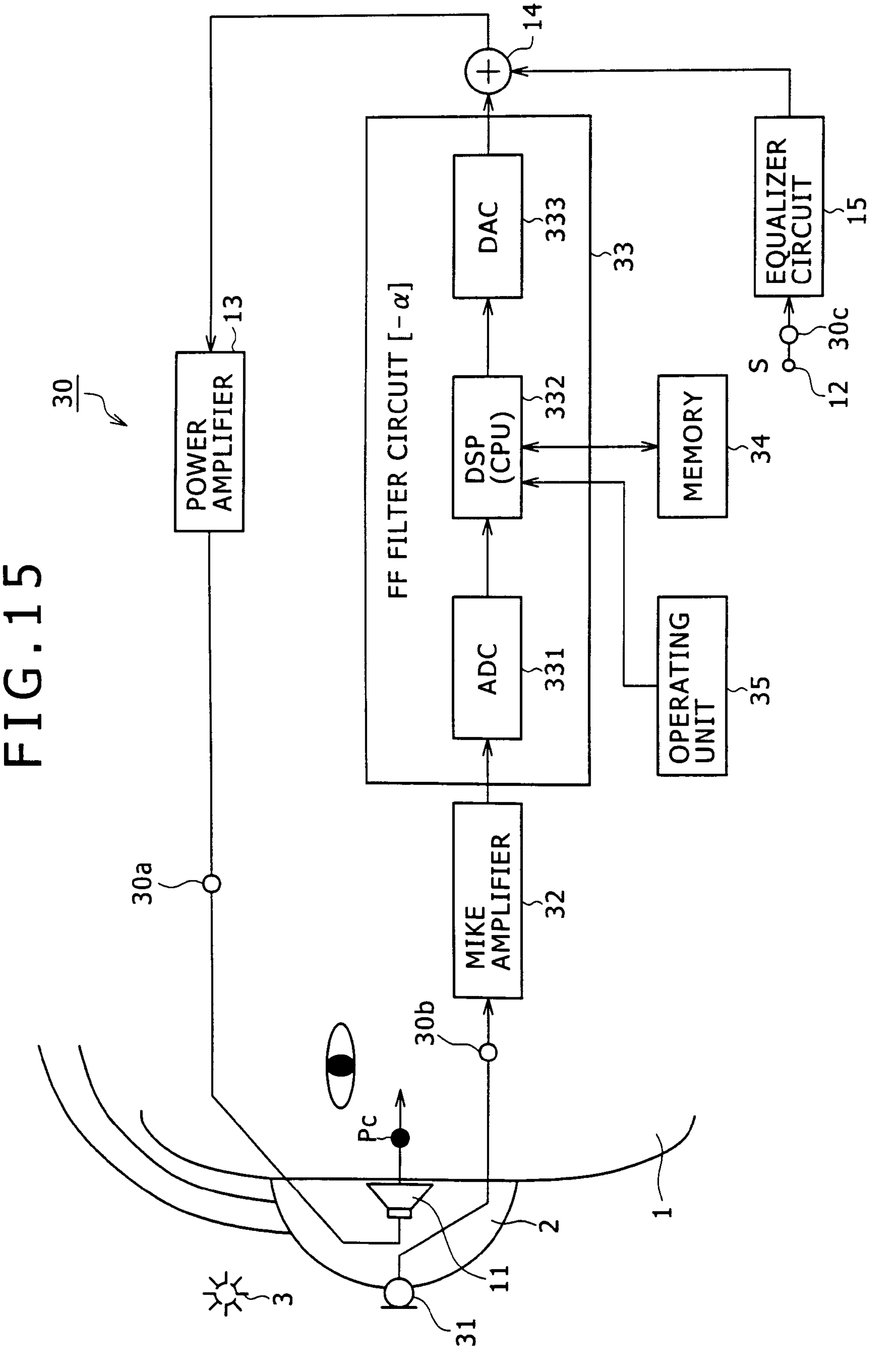
FIG. 15 is a block diagram showing an example of a headphone device to which a second embodiment of a noise reducing device according to the present invention is applied.
Figure 16:
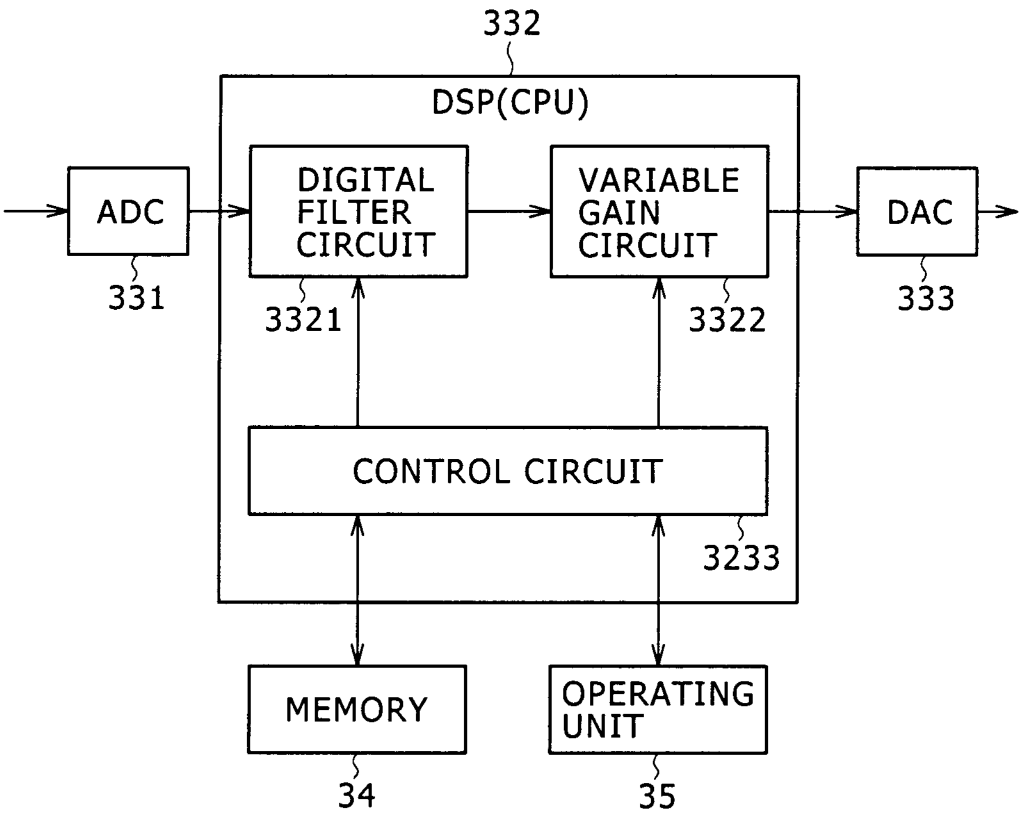
FIG. 16 is a block diagram showing an example of detailed configuration of a part of blocks in FIG. 15.

FIG. 15 shows an example of configuration of an embodiment of a headphone device to which an embodiment of the noise reducing device according to the present invention is applied. FIG. 15 is a block diagram representing a case where a noise reducing system of a feedforward type in place of the feedback system of FIG. 1 is applied. In FIG. 15, the same parts as in FIG. 1 are identified by the same reference numerals.

A noise reducing device section 30 in the second embodiment includes a microphone 31 as acoustic-to-electric converting means, a mike amplifier 32, a filter circuit 33 for noise reduction, a memory 34, an operating unit 35, and the like. As in the first embodiment, the operating unit 35 has a mode switching button for giving an instruction to switch a noise mode.

As in the noise reducing device section 20 of the feedback type as described above, the noise reducing device section 30 is connected to a driver 11, the microphone 31, and a headphone plug forming an audio signal input terminal 12 by connecting cables. References 30*a*, 30*b*, and 30*c* denote a connecting terminal part at which the connecting cables are connected to the noise reducing device section 30.

The second embodiment reduces noise coming from a noise source 3 outside a headphone casing 2 into a music listening position of a listener 1 within the headphone casing 2 in a music listening environment of the listener 1 by the feedforward system, so that music can be listened to in a good environment.

The noise reducing system of the feedforward type basically has the microphone 31 located outside the headphone casing 2 as shown in FIG. 15. A noise 3 collected by the microphone 31 is subjected to an appropriate filtering process to generate a noise reducing audio signal. The generated noise reducing audio signal is acoustically reproduced by the driver 11 within the headphone casing 2, whereby noise (noise 3') is cancelled at a position close to the ear of the listener 1.

The noise 3 collected by the microphone 31 and the noise 3' within the headphone casing 2 have different characteristics corresponding to a difference between spatial positions of the two noises (including a difference between the outside and the inside of the headphone casing 2). Thus, in the feedforward system, the noise reducing audio signal is generated taking into account a difference between spatial transfer functions of the noise from the noise source 3 which noise is collected by the microphone 31 and the noise 3' at a noise canceling point Pc.

In the present embodiment, a digital filter circuit 33 is used as a noise reducing audio signal generating unit of the feedforward system. In the present embodiment, the noise reducing audio signal is generated by the feedforward system, and therefore the digital filter circuit 33 will hereinafter be referred to as an FF filter circuit 33.

In exactly the same manner as the FB filter circuit 23, the FF filter circuit 33 includes a DSP (Digital Signal Processor) 332, an A/D converter circuit 331 provided in a stage preceding the DSP 332, and a D/A converter circuit 333 provided in a stage succeeding the DSP 332.

The DSP 332 in the present embodiment includes a digital filter circuit 3321, a variable gain circuit 3322, and a control circuit 3323. In the case of the feedforward system, it is not necessary to change an equalizer characteristic for an audio signal S according to a change in noise reduction characteristic. Thus, in this example, the DSP 332 is not provided with an equalizer circuit.

As shown in FIG. 15, an analog audio signal obtained by collecting sound by the microphone 31 is supplied to the FF filter circuit 33 via the mike amplifier 32. The analog audio signal is converted into a digital audio signal by the A/D converter circuit 331. The digital audio signal is supplied to the digital filter circuit 3321 in the DSP 332.

The digital filter circuit 3321 in the DSP 332 is a digital filter for generating a digital noise reducing audio signal of the feedforward system. The digital filter circuit 3321 generates the digital noise reducing audio signal having a characteristic corresponding to a filter coefficient as a parameter set in the digital filter circuit 3321 from the digital audio signal input to the digital filter circuit 3321. The filter coefficient set in the digital filter circuit 3321 in the present embodiment is read from the memory 34 and supplied to the digital filter circuit 3321 by the control circuit 3323.

In the present embodiment, the memory 34 stores filter coefficients as a plurality of (plurality of sets of) parameters as later described in order to be able to reduce noise in a plurality of various different noise environments by the noise reducing audio signal of the feedforward system which signal is generated by the digital filter circuit 3321 of the DSP 332.

As in the foregoing first embodiment, the control circuit 3323 reads one particular filter coefficient (one particular set of filter coefficients) from the memory 34, and sets the filter coefficient (the filter coefficient set) in the digital filter circuit 3321 of the DSP 332.

The control circuit 3323 in the present embodiment is supplied with an operating output signal of the operating unit 35. According to the operating output signal from the operating unit 35, the control circuit 3323 selects and reads one particular filter coefficient (one particular set of filter coefficients) from the memory 34, and sets the filter coefficient (the filter coefficient set) in the digital filter circuit 3321 of the DSP 332.

Then, the digital filter circuit 3321 generates the digital noise reducing audio signal corresponding to the filter coefficient selectively read from the memory 34 via the control circuit 3323 and set in the digital filter circuit 3321.

The digital noise reducing audio signal generated in the DSP 332 is then converted into an analog noise reducing audio signal in the D/A converter circuit 333. This analog noise reducing audio signal is supplied as an output signal of the FF filter circuit 33 to an adder circuit 14.

An input audio signal (music signal or the like) S that the listener 1 desires to listen to by headphone is supplied to the adder circuit 14 via the audio signal input terminal 12 and an equalizer circuit 15. The equalizer circuit 15 corrects the sound quality of the input audio signal.

An audio signal as a result of addition by the adder circuit 14 is supplied to the driver 11 via a power amplifier 13 to be acoustically reproduced. The sound acoustically reproduced and emitted by the driver 11 includes an acoustically reproduced component based on the noise reducing audio signal generated in the FF filter circuit 33. The acoustically reproduced component based on the noise reducing audio signal, the acoustically reproduced component being included in the sound acoustically reproduced and emitted by the driver 11, and the noise 3' are acoustically synthesized, whereby the noise 3' is reduced (cancelled) at the noise canceling point Pc.

The parts of the memory 34, the operating unit 35, and the control circuit 3323 of the DSP 332 in the second embodiment are formed in exactly the same manner as the memory 24, the operating unit 25, and the control circuit 2325 in the first embodiment. Each time the mode switching button of the operating unit 35 is pressed, a filter coefficient corresponding to a different noise environment, that is, a noise mode is read from the memory 34 in order and cyclically, and supplied to the FF filter circuit 33.

Figure 17:
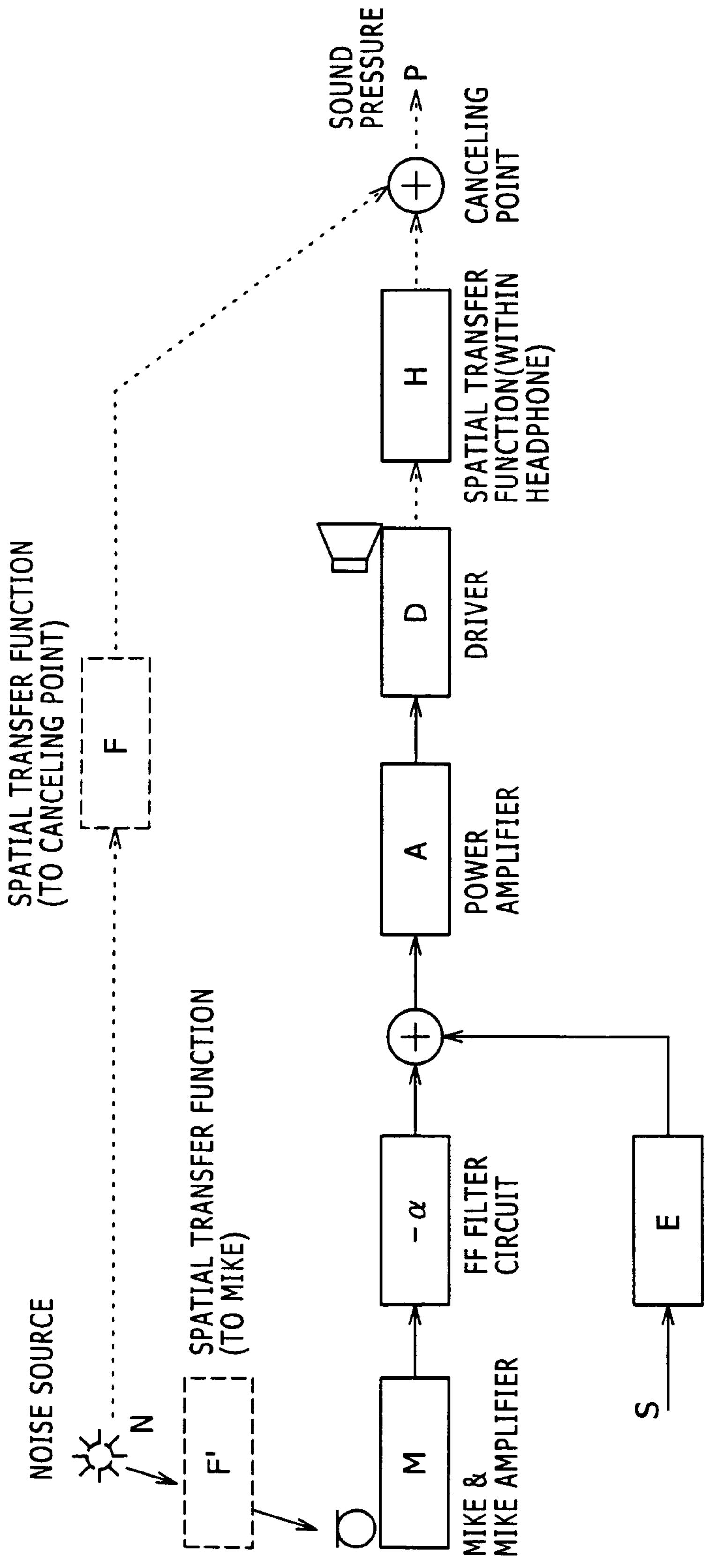
FIG. 17 is a diagram showing a configuration of the second embodiment of the noise reducing device according to the present invention using transfer functions.

The noise reducing operation of the noise reducing device of the feedforward type will next be described using transfer functions with reference to FIG. 17. FIG. 17 is a block diagram representing parts using transfer functions of the parts in correspondence with the block diagram of FIG. 15.

In FIG. 17, A is the transfer function of the power amplifier 13, D is the transfer function of the driver 11, M is the transfer function corresponding to a part of the microphone 31 and the mike amplifier 32, and $-\alpha$ is the transfer function of the digital filter circuit 3321 designed for feedforward. H is the transfer function of a space from the driver 11 to the noise canceling point Pc, and E is the transfer function of the equalizer 15 applied to the audio signal S to be listened to. F is a transfer function from the position of noise N of the external noise source 3 to the position of the noise canceling point Pc in the ear of the listener.

When represented as in FIG. 17, the blocks of FIG. 17 can be expressed by (Equation 5) in FIG. 4. Incidentally, F' denotes a transfer function from the noise source to the position of the mike. Suppose that each of the above-described transfer functions is expressed by complex representation.

Considering an ideal state and supposing that the transfer function F can be represented as in (Equation 6) in FIG. 4, (Equation 5) in FIG. 4 can be represented by (Equation 7) in FIG. 4. It is thus shown that the noise is cancelled, and that only the music signal (or the desired music signal or the like to be listened to) S is left, so that the same sound as in an ordinary headphone operation can be listened to. A sound pressure P at this time is expressed as in (Equation 7) in FIG. 4.

In actuality, however, it is difficult to configure a perfect filter having a transfer function such that (Equation 6) in FIG. 4 holds perfectly. As far as a medium-frequency band and a high-frequency band in particular are concerned, there are great individual differences in manner of wearing the headphone and shape of the ear, and characteristics are changed depending on the position of the noise and the position of the mike, for example. For this reason, in general, as far as the medium-frequency band and the high-frequency band are concerned, the active noise reducing process is not performed, and passive sound insulation is often performed by the headphone casing 2.

Incidentally, (Equation 6) in FIG. 4 indicates that, as is obvious from the equation, the transfer functions from the noise source to the position of the ear are imitated in electric circuitry including the transfer function a of the digital filter.

Incidentally, the canceling point in the feedforward type of the second embodiment can be set at an arbitrary ear position of the listener as shown in FIG. 15, unlike the feedback type of the first embodiment shown in FIG. 1.

In a normal case, however, the transfer function a of the digital filter circuit 3321 is fixed and determined aiming at some target characteristic in a design stage. Because of differences in shape of the ear, some people cannot obtain a sufficient noise canceling effect, or a noise component in a non-opposite phase may be added, causing a phenomenon of occurrence of strange sound, for example.

Figure 18:
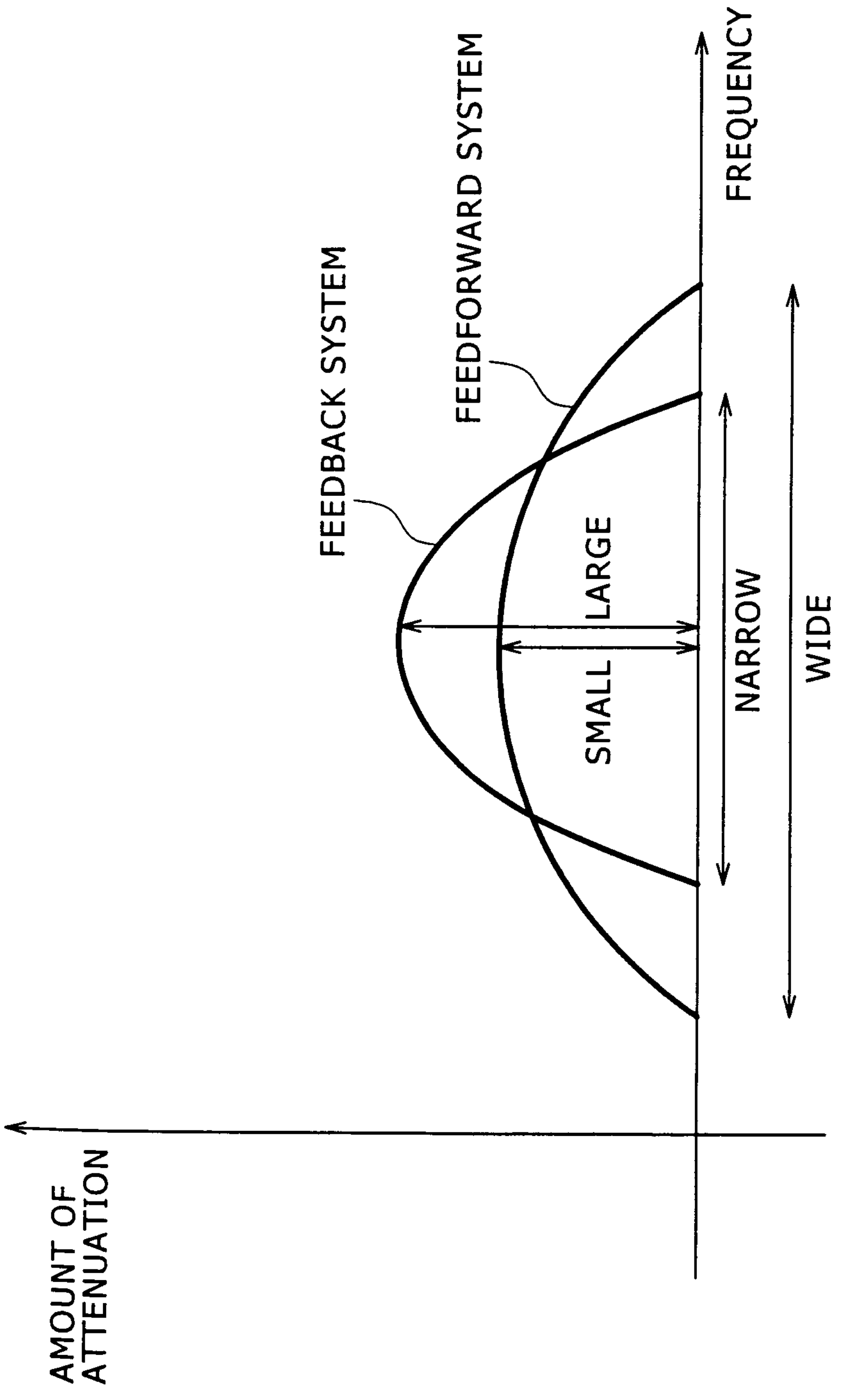
FIG. 18 is a diagram of assistance in explaining attenuating characteristics of a noise reducing system of a feedback type and a noise reducing system of a feedforward type.

In general, as shown in FIG. 18, with the feedforward system of the second embodiment, there is a small possibility of oscillation and thus high stability is obtained, but it is difficult to obtain a sufficient amount of attenuation. On the other hand, with the feedback system of the first embodiment, a large amount of attenuation can be expected, but instead attention may need to be paid to the stability of the system.

Incidentally, it is possible to form the equalizer circuit 15 within the DSP 332, convert the audio signal S into a digital signal, and supply the digital signal to the equalizer circuit within the DSP 332.

Also in the second embodiment, at a time of switching and changing the noise mode, control operations as described in the foregoing first to third examples are performed under control of the control circuit 3323 in exactly the same manner as in the first embodiment.

THIRD EMBODIMENT AND FOURTH EMBODIMENT

In the first embodiment and the second embodiment described above, the filter circuit is digitized, and a plurality of kinds of filter coefficients for the filter circuit are prepared in the memory. As required, an appropriate filter coefficient can be selected from the plurality of kinds of filter coefficients and then set in the digital filter.

However, the digitized FB filter circuit 23 and the digitized FF filter circuit 33 have a problem of delay in the A/D converter circuits 231 and 331 and the D/A converter circuits 233 and 333. This problem of delay will be described below with reference to the noise reducing system of the feedback type.

For example, when an A/D converter circuit and a D/A converter circuit having a sampling frequency Fs of 48 kHz are used as a common example, supposing that an amount of delay caused within the A/D converter circuit and the D/A converter circuit is 20 samples in each of the A/D converter circuit and the D/A converter circuit, a delay of a total of 40 samples is included in the block of the FB filter circuit 23 in addition to an operation delay in the DSP. As a result, the delay is applied as a delay of an open loop to the whole of the system.

Figure 19A:
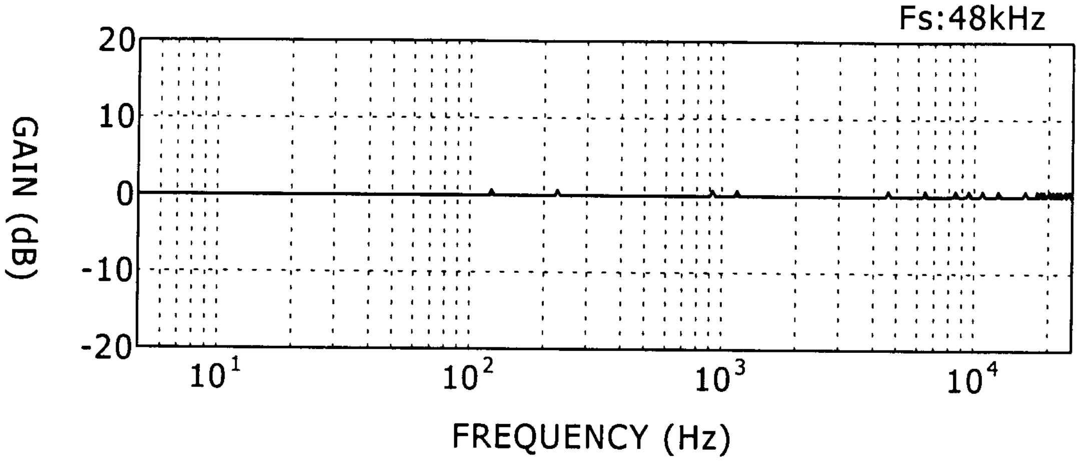
FIGS. 19A and 19B are diagrams of assistance in explaining a third embodiment and a fourth embodiment.
Figure 19B:
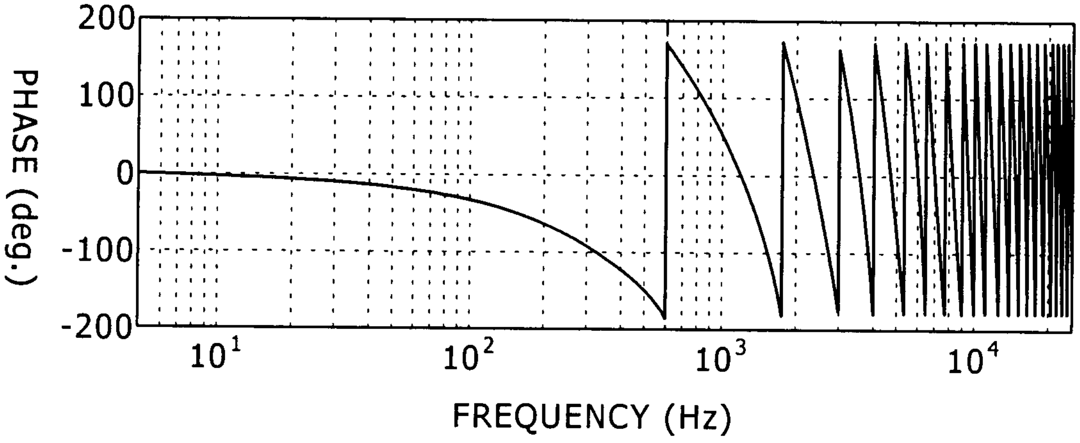
Figure 20A:
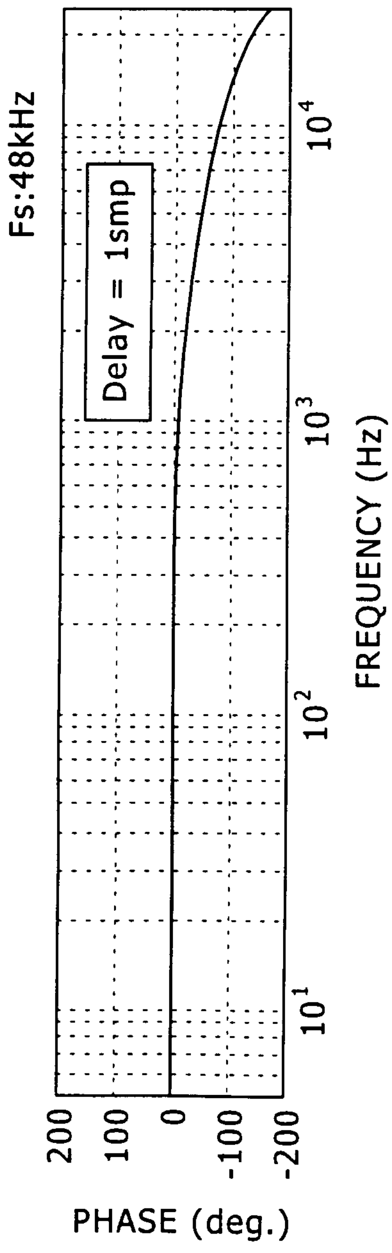
FIGS. 20A, 20B, and 20C are diagrams of assistance in explaining the third embodiment and the fourth embodiment.
Figure 20B:
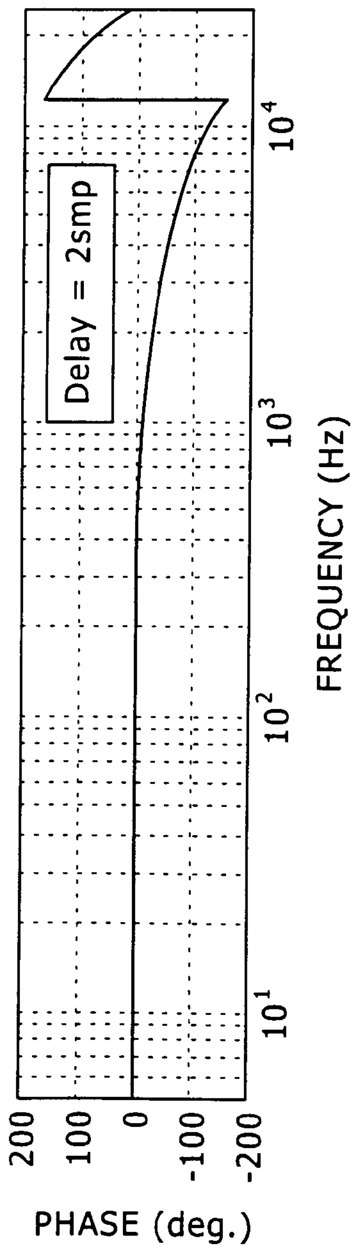
Figure 20C:
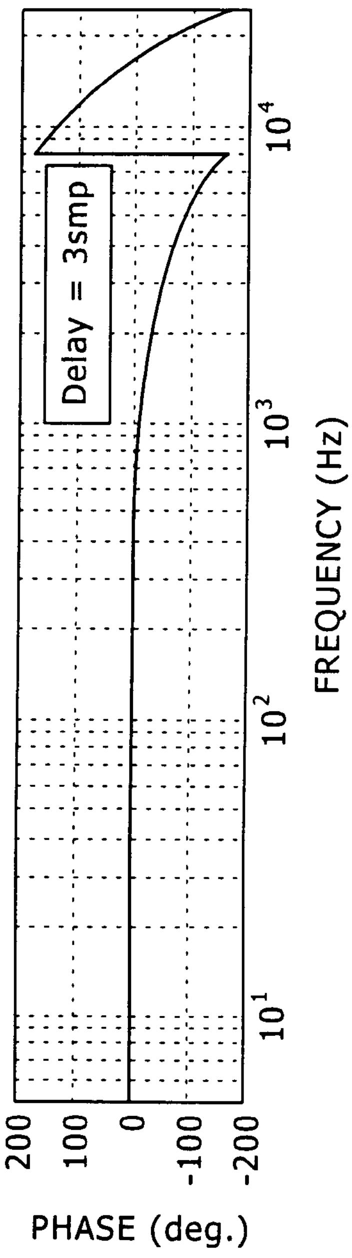

Specifically, a gain and a phase corresponding to the delay of 40 samples at the sampling frequency of 48 kHz are shown in FIG. 19A. A phase rotation starts at a few ten Hz, and the phase is rotated greatly up to a frequency of Fs/2 (24 kHz). This can be easily understood on realizing that, as shown in FIGS. 20A, 20B, and 20C, a delay of one sample at the sampling frequency of 48 kHz corresponds to a delay of 180 deg. ($\pi$) at the frequency of Fs/2 and, similarly, delays of two samples and three samples correspond to delays of $2\pi$ and $3\pi$.

Figure 21A:
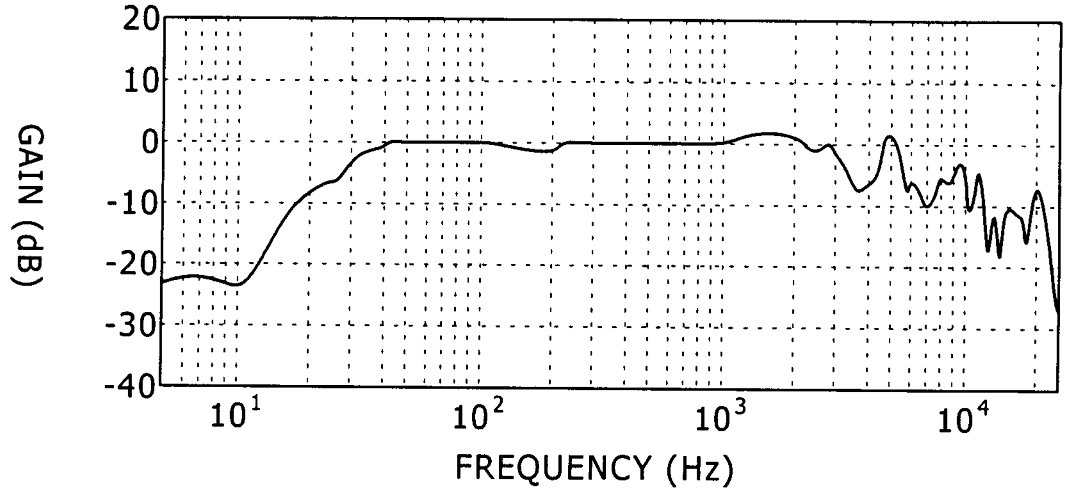
FIGS. 21A and 21B are diagrams of assistance in explaining the third embodiment and the fourth embodiment.
Figure 21B:
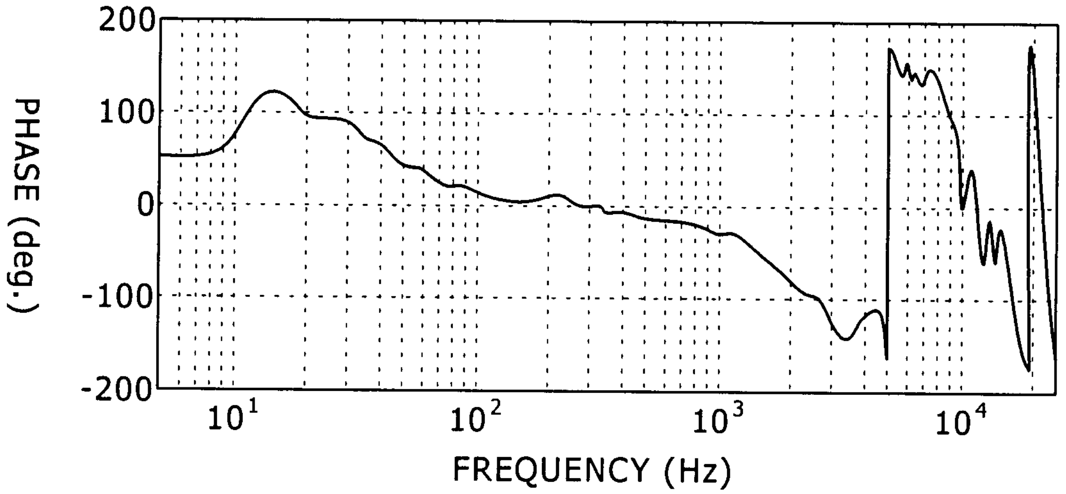

FIGS. 21A and 21B show measurements of a transfer function from the position of the driver 11 to the microphone 21 in a headphone configuration having an actual noise reducing system supposing a feedback constitution. It is shown that in this case, the microphone 21 is disposed in the vicinity of the front surface of the diaphragm of the driver 11, and that because of a short distance between the microphone 21 and the driver 11, a relatively small phase rotation occurs.

The transfer function shown in FIGS. 21A and 21B corresponds to ADHM in (Equation 1) and (Equation 2) shown in FIG. 4. A result of multiplying this and the filter having the characteristic of the transfer function $-\beta$ on a frequency axis constitutes an open loop as it is. The shape of the open loop may need to meet the above-described conditions shown using (Equation 2) shown in FIG. 4 and FIG. 5.

Looking at the phase characteristics of FIG. 19A once again, it is shown that starting at 0 deg., one round ($2\pi$) of rotation is made at about 1 kHz. In addition to this, in the ADHM characteristics of FIGS. 21A and 21B, there is a phase delay depending on the distance from the driver 11 to the microphone 21.

In the FB filter circuit 23, the digital filter part formed in the DSP 232 that can be designed freely is connected in series with the delay components in the A/D converter circuit 231 and the D/A converter circuit 233. However, it is basically difficult to design a phase advance filter in the digital filter part in view of causality. While a "partial" phase advance in only a particular band is possible depending on the configuration of filter shape, it may be impossible to create a phase advance circuit for a wide band such as compensates for the phase rotation due to this delay.

Considering this, even when an ideal digital filter of the transfer function $-\beta$ is designed by the DSP 232, in this case, a band in which a noise reduction effect can be obtained by the feedback constitution is limited to about 1 kHz, at which one round of phase rotation is made, and lower. When supposing an open loop incorporating even the ADHM characteristic, and allowing for a phase margin and a gain margin, the amount of attenuation and the attenuating band are further reduced.

Figure 22A:
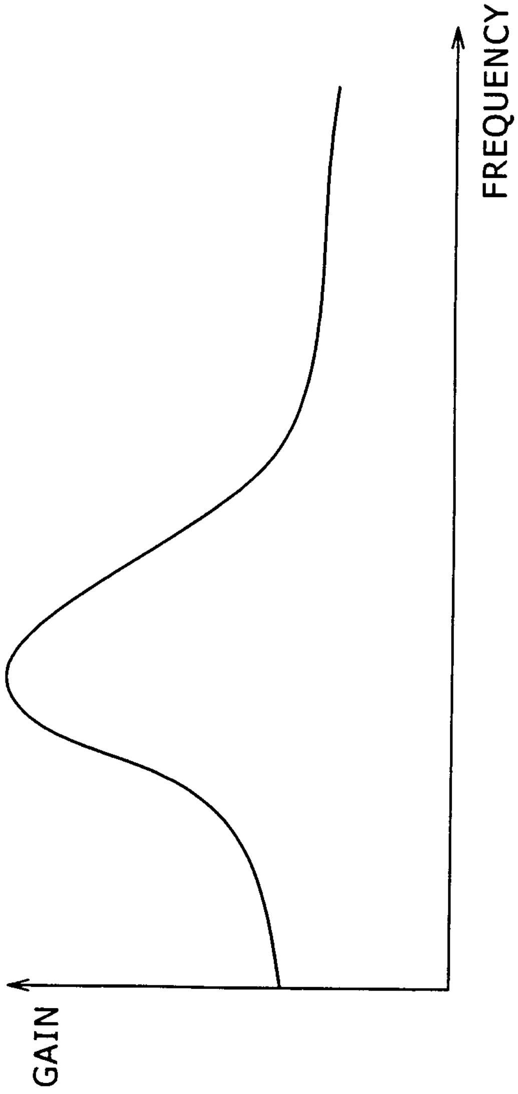
FIGS. 22A and 22B are diagrams of assistance in explaining the third embodiment and the fourth embodiment.
Figure 22B:
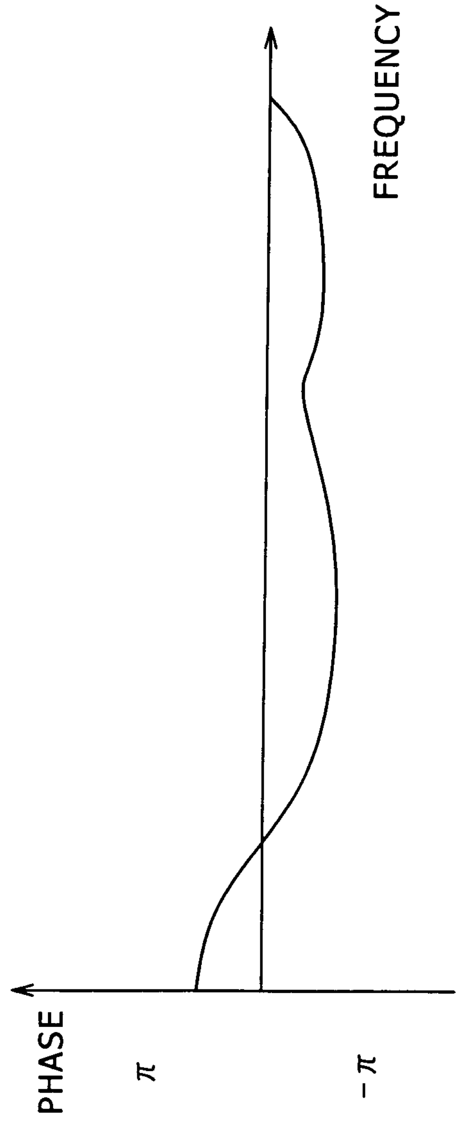

In this sense, it is shown that a desirable $\beta$ characteristic (a phase inversion system within the block of the transfer function $-\beta$) for the characteristics as shown in FIGS. 21A and 21B is such that, as shown in FIGS. 22A and 22B, a gain shape is substantially the shape of a chevron in a band where noise reduction effect is to be produced, while phase rotation does not occur very much (the phase characteristic does not make one rotation in a range from a low-frequency band to a high-frequency band in FIG. 22B). Accordingly, an immediate objective is to design the entire system such that the phase is prevented from making one rotation.

Incidentally, in essence, when the phase rotation is small in a band to be subjected to noise reduction (primarily a low-frequency band), a phase change outside the band is not of concern as long as the gain is not decreased. In general, however, a large amount of phase rotation in a high-frequency band has no small effect on a low-frequency band. It is accordingly an object of the present embodiment to make a design with the phase rotation reduced over a wide band.

In addition, characteristics as shown in FIGS. 22A and 22B can be designed in an analog circuit. In this sense, it is not desirable to greatly impair the noise reduction effect as compared with a case of making a system design with an analog circuit in exchange for advantages of forming the above-described digital filter.

Increasing the sampling frequency reduces the delays in the A/D converter circuit and the D/A converter circuit. A headphone device with the increased sampling frequency is very expensive as a product, but is feasible for military purposes and industrial purposes. However, such a headphone device is too expensive as a product for the general consumer such as a headphone device for music listening or the like, and is thus less practical.

Accordingly, in the third embodiment and the fourth embodiment, a method is provided which can further increase the noise reduction effect while utilizing the advantages of the digitization in the first embodiment and the second embodiment.

Figure 23:
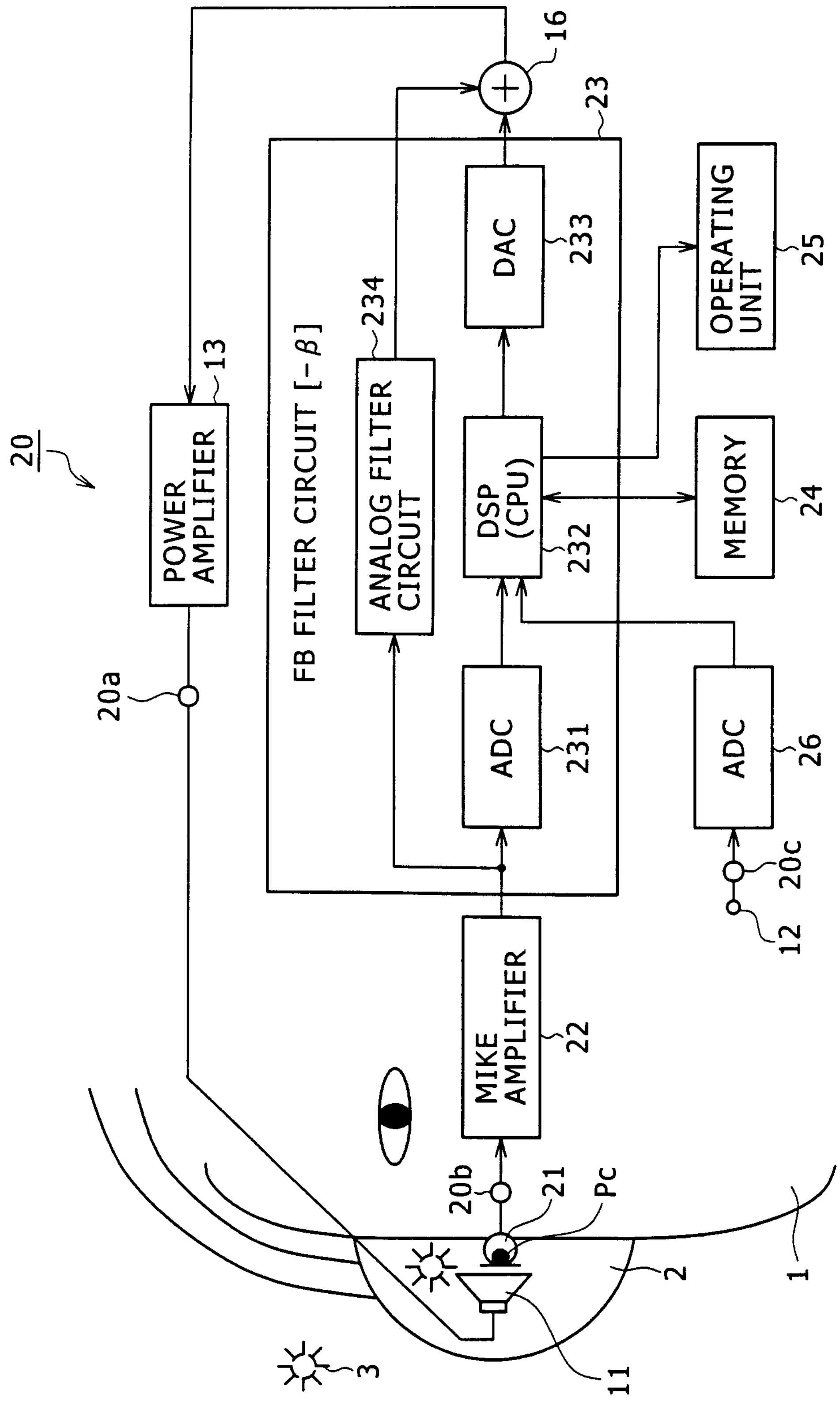
FIG. 23 is a block diagram of an example of a headphone device to which the third embodiment of the noise reducing device according to the present invention is applied.

FIG. 23 is a block diagram showing a configuration of a headphone device according to the third embodiment. The third embodiment is an improvement over the configuration of the noise reducing device section 20 using the feedback system of the first embodiment.

In the third embodiment, as shown in FIG. 23, an FB filter circuit 23 is formed by providing an analog processing system formed by an analog filter circuit 234 in parallel with a digital processing system formed by an A/D converter circuit 231, a DSP 232, and a D/A converter circuit 233.

An analog noise reducing audio signal generated by the analog filter circuit 234 is added to an adder circuit 16. An analog signal from the D/A converter circuit 233 in an FB filter circuit 23 is supplied to the adder circuit 16 to be added to the signal from the analog filter circuit 234. Then an output signal of the adder circuit 16 is supplied to a power amplifier 13. Otherwise, the configuration of the headphone device according to the third embodiment is exactly the same as the configuration shown in FIG. 1.

Incidentally, the analog filter circuit 234 in FIG. 23 actually includes a case where the analog filter circuit 234 passes through an input audio signal as it is without performing filter processing on the input audio signal, and supplies the input audio signal to the adder circuit 16. In this case, no analog element is present in the analog processing system, and thus a highly reliable system is obtained in terms of variations and stability.

In the FB filter circuit 23 according to the third embodiment, a filter coefficient to be stored in a memory 24 as described above is designed such that a result of adding together two signals after parallel processing by the digital processing system and the analog processing system has a gain characteristic and a phase characteristic as shown in FIGS. 22A and 22B as characteristics of the transfer function β.

According to the third embodiment, by adding the path of the analog processing system in parallel with the path of the digital processing system, it is possible to alleviate the above-described problems, and perform excellent noise reduction according to various noise environments.

Figure 24A:
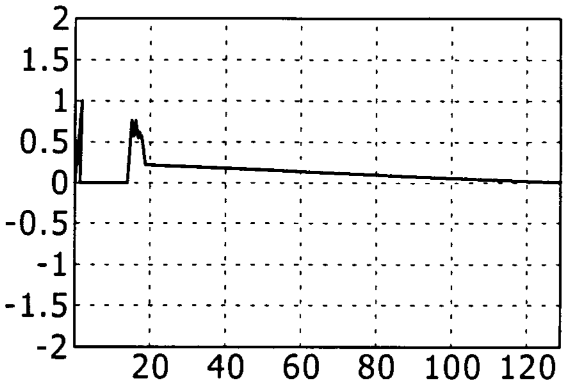
FIGS. 24A, 24B, and 24C are diagrams of assistance in explaining characteristics of the third embodiment of the noise reducing device according to the present invention.
Figure 24B:
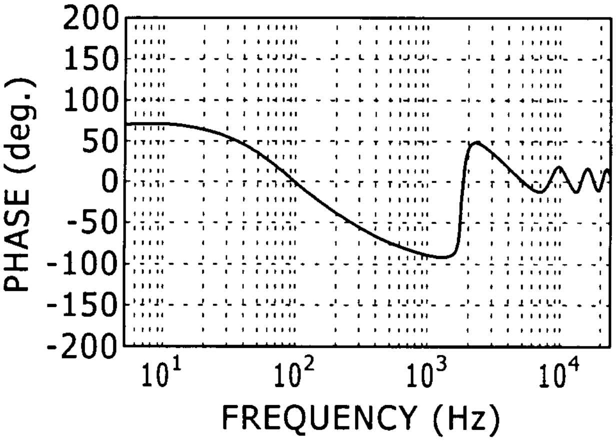
Figure 24C:
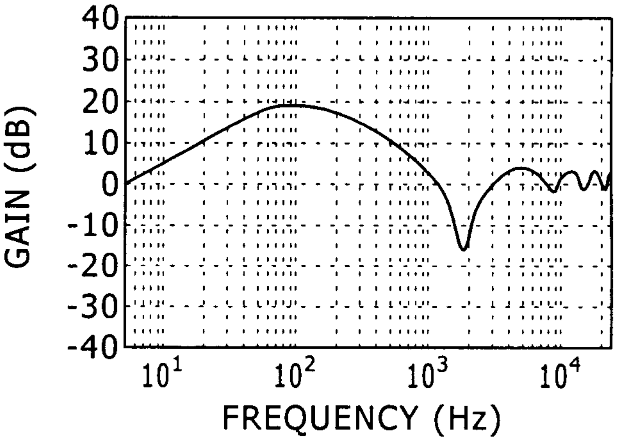

Characteristics when the path of the analog processing system (in the case of passing through an input audio signal) is added in parallel with the path of the digital processing system are shown in FIGS. 24A, 24B, and 24C. FIG. 24A shows a head part (up to 128 samples) of impulse response of a transfer function in this example. FIG. 24B shows a phase characteristic. FIG. 24C shows a gain characteristic.

FIG. 24B shows that according to the third embodiment, phase rotation is suppressed by adding the analog path, and that one phase rotation is not made in a range from a low-frequency band to a high-frequency band viewing the characteristics from another aspect, effect of the processing system including the digital filter on a low-frequency characteristic as a main part for noise reduction becomes greater, whereas the characteristic of the quick-response analog path is used effectively for the medium-frequency band and the high-frequency band in which the phase rotation tends to be large due to the delays in the A/D converter circuit and the D/A converter circuit.

Thus, according to the third embodiment, it is possible to provide a noise reducing device and a headphone device that can perform noise reduction adapted to various noise environments without increasing a configuration scale.

While the third embodiment represents a case of performing noise reduction by the feedback system, the third embodiment is similarly applicable to a case of performing noise reduction by the feedforward system of the second embodiment.

Also in the third embodiment, at a time of switching and changing the noise mode, control operations as described in the foregoing first to third examples are performed under control of a control circuit 2323 in exactly the same manner as in the first embodiment.

Figure 25:
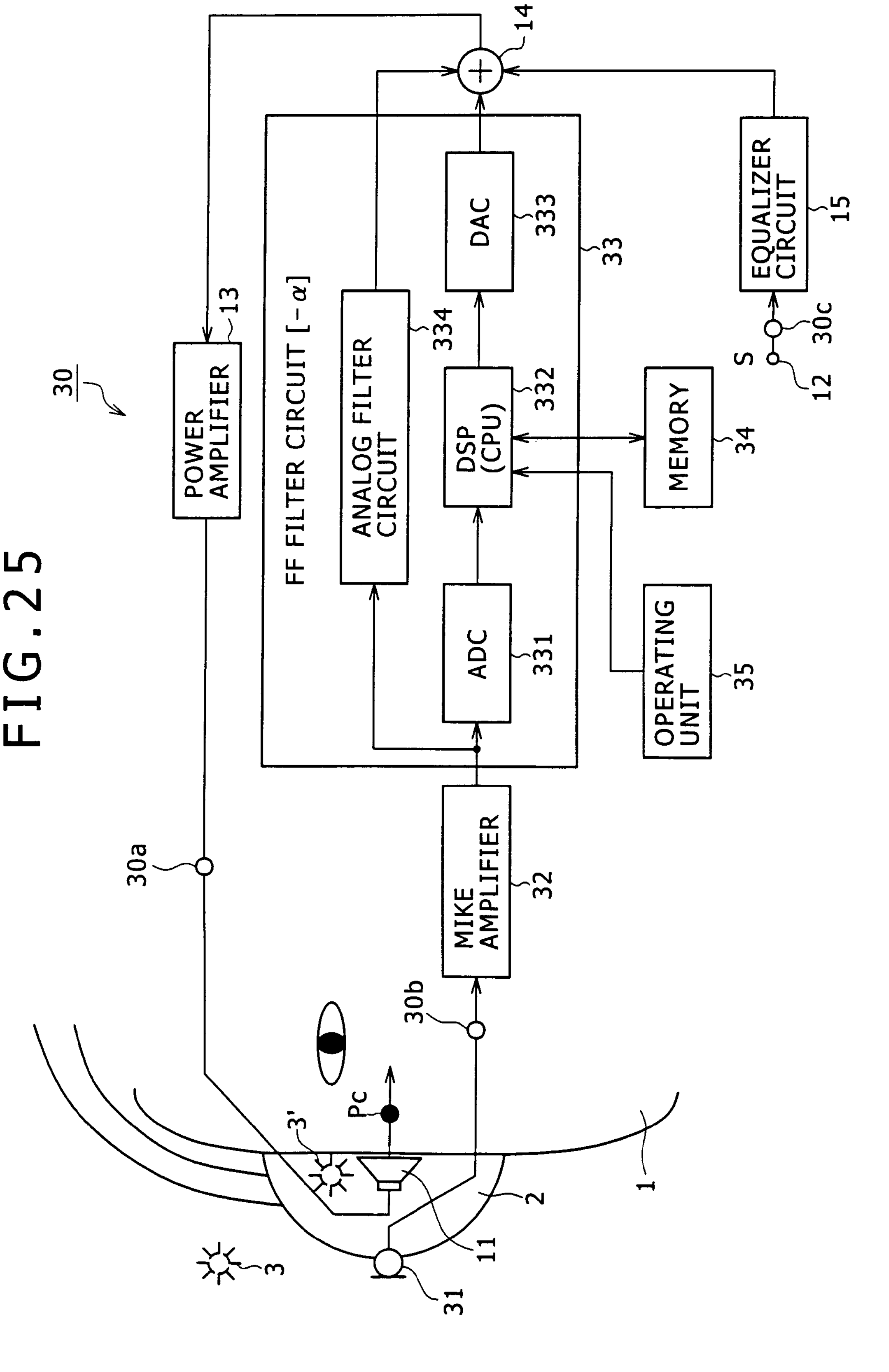
FIG. 25 is a block diagram showing an example of a headphone device to which the fourth embodiment of the noise reducing device according to the present invention is applied.

Next, the fourth embodiment remedies the problems in using only the digital filter as described above in the second embodiment performing the noise reduction of the feedforward system. FIG. 25 shows an example of configuration of the fourth embodiment.

Specifically, in the fourth embodiment, an FF filter circuit 33 is formed by providing an analog processing system formed by an analog filter circuit 334 in parallel with a digital processing system formed by an A/D converter circuit 331, a DSP 332, and a D/A converter circuit 333.

An analog noise reducing audio signal generated by the analog filter circuit 334 is added to an adder circuit 14. Otherwise, the configuration of the headphone device according to the fourth embodiment is exactly the same as the configuration shown in FIG. 15.

Incidentally, the analog filter circuit 334 in FIG. 25 includes a case where the analog filter circuit 334 passes through an input audio signal as it is without performing filter processing on the input audio signal, and supplies the input audio signal to the adder circuit 14. In this case, no analog element is present in the analog processing system, and thus a highly reliable system is obtained in terms of variations and stability.

In the FF filter circuit 33 according to the fourth embodiment, a filter coefficient to be stored in a memory 34 as described above is designed such that a result of adding together two signals after parallel processing by the digital processing system and the analog processing system has a gain characteristic and a phase characteristic as shown in FIGS. 22A and 22B as characteristics of the transfer function a.

Incidentally, it is possible to form an equalizer circuit 15 within the DSP 232 or 332, convert the audio signal S into a digital signal, and supply the digital signal to the equalizer circuit within the DSP 232 or 332.

Also in the fourth embodiment, at a time of switching and changing the noise mode, control operations as described in the foregoing first to third examples are performed under control of a control circuit 3323 in exactly the same manner as in the second embodiment.

FIFTH EMBODIMENT

As described above, with the feedforward system of the second embodiment, there is a small possibility of oscillation and thus high stability is obtained, but it is difficult to obtain a sufficient amount of attenuation, whereas with the feedback system of the first embodiment, a large amount of attenuation can be expected, but instead attention may need to be paid to the stability of the system.

Accordingly, the fifth embodiment provides a noise reducing system having advantages of both systems. That is, as shown in FIG. 26, the fifth embodiment has both of a noise reducing device section 20 of the feedback system and a noise reducing device section 30 of the feedforward system.

Figure 26:
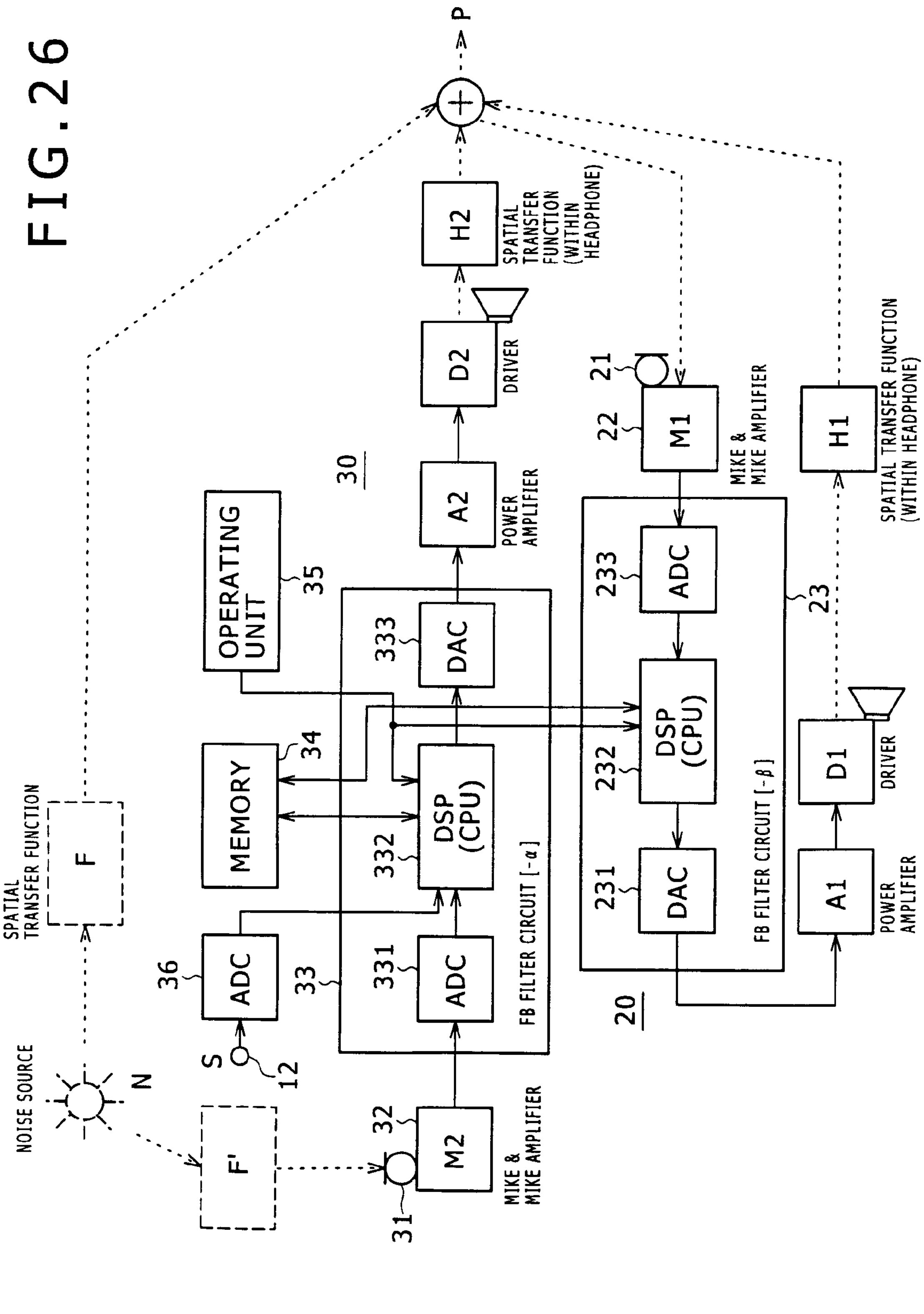
FIG. 26 is a block diagram showing an example of a headphone device to which a fifth embodiment of the noise reducing device according to the present invention is applied.

Incidentally, FIG. 26 shows a block configuration using transfer functions. In the noise reducing device section 20 of the feedback system, a transfer function corresponding to a part of a microphone 21 and a mike amplifier 22 is M1. The transfer function of a power amplifier for subjecting a noise reducing audio signal generated by an FB filter circuit 23 to output amplification is A1. The transfer function of a driver for acoustically reproducing the noise reducing audio signal is D1. A spatial transfer function from the driver to a canceling point Pc is H1.

In the noise reducing device section 30 of the feedforward system, a transfer function corresponding to a part of a microphone 31 and a mike amplifier 32 is M2. The transfer function of a power amplifier for subjecting a noise reducing audio signal generated by an FF filter circuit 33 to output amplification is A2. The transfer function of a driver for acoustically reproducing the noise reducing audio signal is D2. A spatial transfer function from the driver to the canceling point Pc is H2.

In the embodiment of FIG. 26, a memory 34 stores a plurality of sets of filter coefficients to be supplied to each of the FB filter circuit 23 and the FF filter circuit 33. Control circuits 2325 and 3323 included in DSPs 232 and 332 each select an appropriate filter coefficient from the plurality of sets of filter coefficients for each of the FB filter circuit 23 and the FF filter circuit 33 according to a noise switching button pressing operation by a user via an operating unit 35 as described above. The control circuits 2325 and 3323 then set the filter coefficients in the filter circuits 23 and 33, respectively.

In the example of FIG. 26, a system for acoustically reproducing the noise reducing audio signal generated in the noise reducing device section of the feedback system and a system for acoustically reproducing the noise reducing audio signal generated in the noise reducing device section of the feedforward system are provided separately from each other.

In the example of FIG. 26, the power amplifier and the driver of the system for acoustically reproducing the noise reducing audio signal generated in the noise reducing device section of the feedback system are used only for noise reduction, while the power amplifier and the driver of the system for acoustically reproducing the noise reducing audio signal generated in the noise reducing device section of the feedforward system are used not only for noise reduction but also for acoustically reproducing an audio signal S to be listened to. Thus, the audio signal S is passed through an input terminal 12 and then converted into a digital audio signal by an A/D converter circuit 36, and the digital audio signal is supplied to a digital equalizer circuit formed within the DSP 332.

Further, in the example of FIG. 26, the audio signal S to be listened to is converted into a digital audio signal by the A/D converter circuit 36, and the digital audio signal is then supplied to the DSP 332 in the FF filter circuit 33. Though not shown in the figure, the DSP 332 in this example includes not only a digital filter for generating the noise reducing audio signal of the feedforward system but also an equalizer circuit for adjusting the audio characteristic of the audio signal S to be listened to and an adder circuit. An output audio signal of the equalizer circuit and the noise reducing audio signal generated in the digital filter are added together in the adder circuit, and then the result is output from the DSP 332.

The noise reducing device section 20 of the feedback system and the noise reducing device section 30 of the feedforward system in the fifth embodiment perform noise reducing process operation as described above independently of each other. However, the noise canceling point Pc is the same position in both systems.

Thus, according to the fifth embodiment, the noise reducing processes of the feedback system and the feedforward system operate complementarily, and thus a noise reducing system providing advantages of both systems can be realized.

Incidentally, in FIG. 26, the filter coefficients of the digital filters in both of the feedback system and the feedforward system are changed. However, the filter coefficient of only the digital filter of one system, for example only the digital filter of the feedforward system may be selected and changed.

In addition, in the example of FIG. 26, the FB filter circuit 23 and the FF filter circuit 33 are formed by respective separate DSPs. However, the FB filter circuit 23 and the FF filter circuit 33 can be formed by one DSP to simplify the entire circuit configuration. In addition, in the example of FIG. 26, the power amplifier and the driver in the noise reducing device section 20 of the feedback system are provided separately from the power amplifier and the driver in the noise reducing device section 30 of the feedforward system. However, the power amplifiers and the drivers can be formed by one power amplifier 15 and one driver 11 as in the foregoing embodiments. An example of such a formation is shown in FIG. 27.

Figure 27:
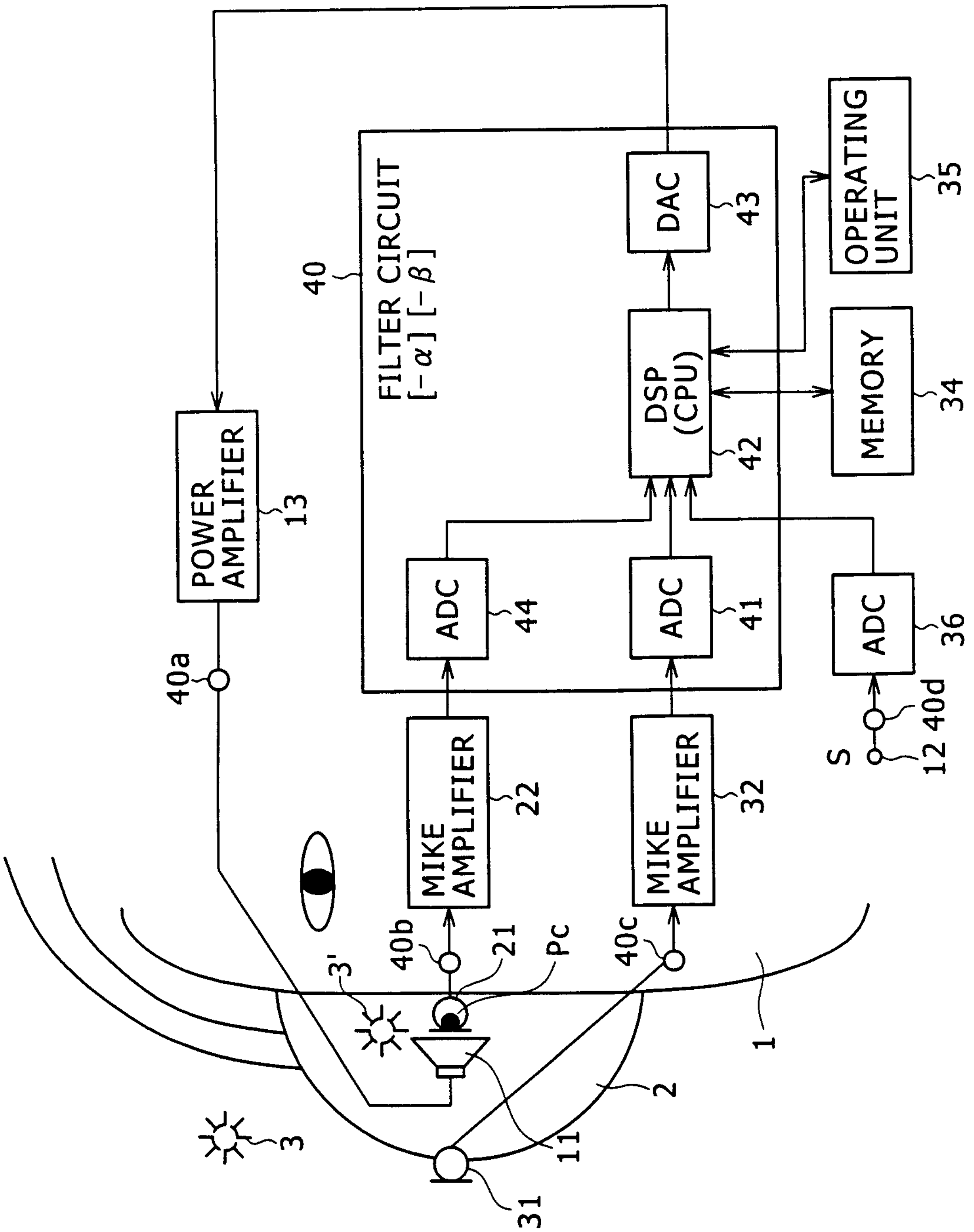
FIG. 27 is a block diagram showing another example of the headphone device to which the fifth embodiment of the noise reducing device according to the present invention is applied.

Specifically, the example of FIG. 27 has a filter circuit 40 including an A/D converter circuit 41, a DSP 42, a D/A converter circuit 43, and an A/D converter circuit 44. An analog audio signal from a mike amplifier 22 is converted into a digital audio signal by the A/D converter circuit 44. The digital audio signal is then supplied to the DSP 42. An audio signal S to be listened to which signal is input via an input terminal 12 is converted into a digital audio signal by an A/D converter circuit 36. The digital audio signal is then supplied to the DSP 42.

Figure 28:
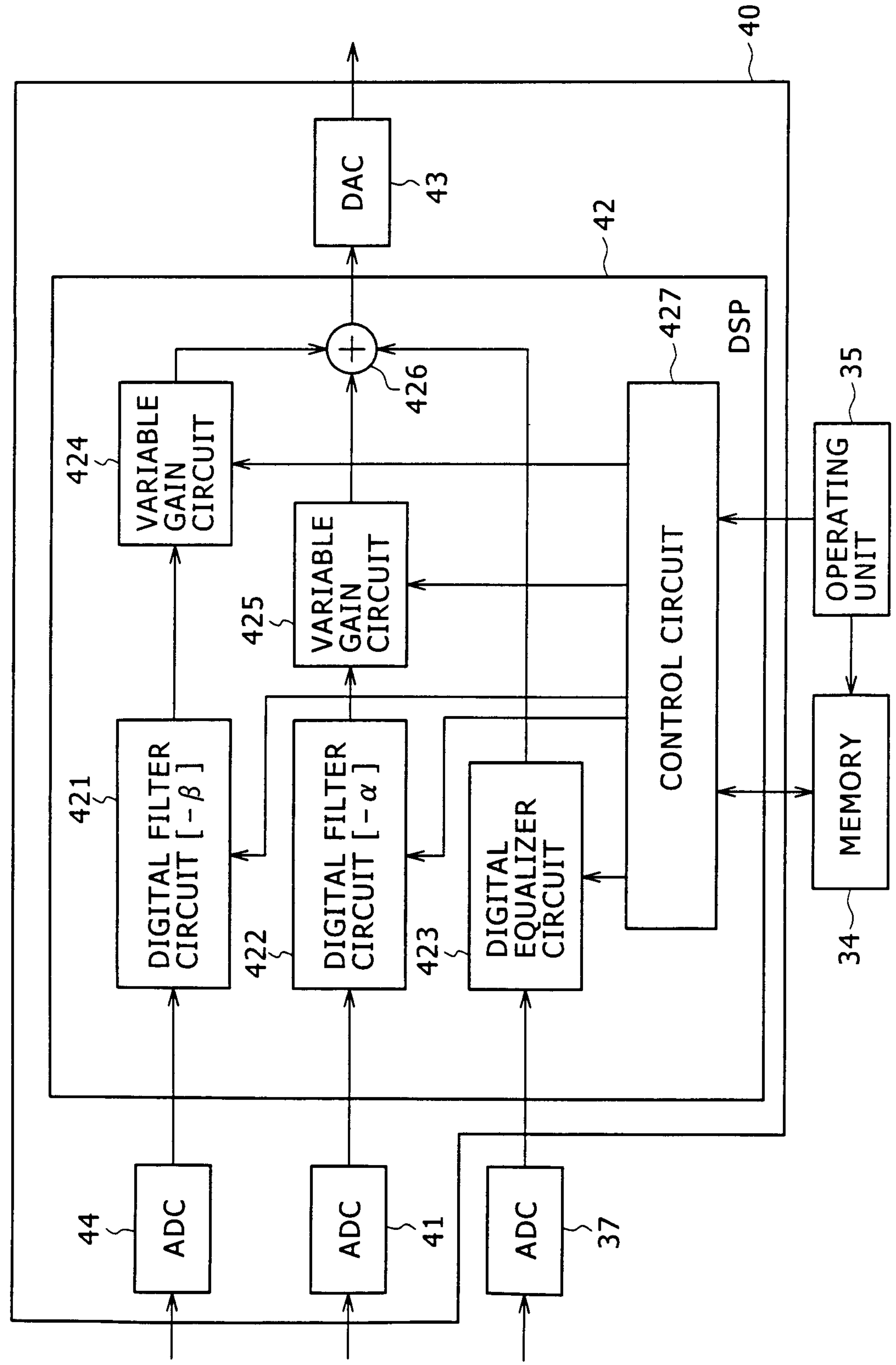
FIG. 28 is a diagram showing an example of detailed configuration of a part of blocks in FIG. 18.

In this example, as shown in FIG. 28, the DSP 42 includes: a digital filter circuit 421 for obtaining a noise reducing audio signal of the feedback system; a digital filter circuit 422 for obtaining a noise reducing audio signal of the feedforward system; a digital equalizer circuit 423; a variable gain circuit 424; a variable gain circuit 425; an adder circuit 426; and a control circuit 427.

The digital audio signal (digital signal of sound collected by a microphone 21) from the A/D converter circuit 44 is supplied to the digital filter circuit 421. A digital audio signal (digital signal of sound collected by a microphone 31) from the A/D converter circuit 41 is supplied to the digital filter circuit 422. The digital audio signal (digital signal of sound to be listened to) from the A/D converter circuit 36 is supplied to the equalizer circuit 423.

As described above, in the present example, a memory 34 stores a plurality of (plurality of sets of) filter coefficients for the digital filter circuit 421 and a plurality of (plurality of sets of) filter coefficients for the digital filter circuit 422. According to a user operation via an operating unit 35, the control circuit 427 selects a filter coefficient for the digital filter circuit 421 and the digital filter circuit 422 from the memory 34. The control circuit 427 supplies the filter coefficients to the digital filter circuit 421 and the digital filter circuit 422.

The memory 34 also stores parameters for making the equalizer characteristic of the digital equalizer circuit 423 correspond to the plurality of (plurality of sets of) filter coefficients for the digital filter circuit 422. According to a user operation via the operating unit 35, the control circuit 427 selectively reads a parameter for the equalizer characteristic from the memory 34 in such a manner as to correspond to the selection of the filter coefficient for the digital filter circuit 422. The control circuit 427 then supplies the parameter to the digital equalizer circuit 423.

As in the foregoing embodiments, the variable gain circuits 424 and 425 are provided on an output side of the digital filter circuit 421 and the digital filter circuit 422. Under control of the control circuit 427, the variable gain circuits 424 and 425 control noise reduction effect at a time of changing the noise mode as described above.

The noise reducing audio signals generated in the digital filter circuit 421 and the digital filter circuit 422, the noise reducing audio signals being obtained through the variable gain circuits 424 and 425, and a digital audio signal from the equalizer circuit 423 are supplied to the adder circuit 426 to be added together. A result of the addition is supplied to the D/A converter circuit 43 to be converted into an analog audio signal. The analog audio signal from the D/A converter circuit 43 is supplied to a driver 11 via a power amplifier 13. Thereby, noise 3' is reduced (cancelled) at a noise canceling point Pc.

Incidentally, references 40*a*, 40*b*, 40*c*, and 40*d* in FIG. 27 denote a connecting terminal part for connecting connecting cables between the noise reducing device section and the driver 11, the microphone 21, the microphone 31, and the input terminal 12 (headphone plug).

Also in the fifth embodiment, at a time of switching and changing the noise mode, control operations as described in the foregoing first to third examples are performed under control of the control circuit 427 in exactly the same manner as in the first and second embodiments.

SIXTH EMBODIMENT

In view of the problem of the delays in the A/D converter circuit and the D/A converter circuit in the fifth embodiment, which performs only digital processing, the sixth embodiment remedies the problem in question, as in the third and fourth embodiments described above.

Figure 29:
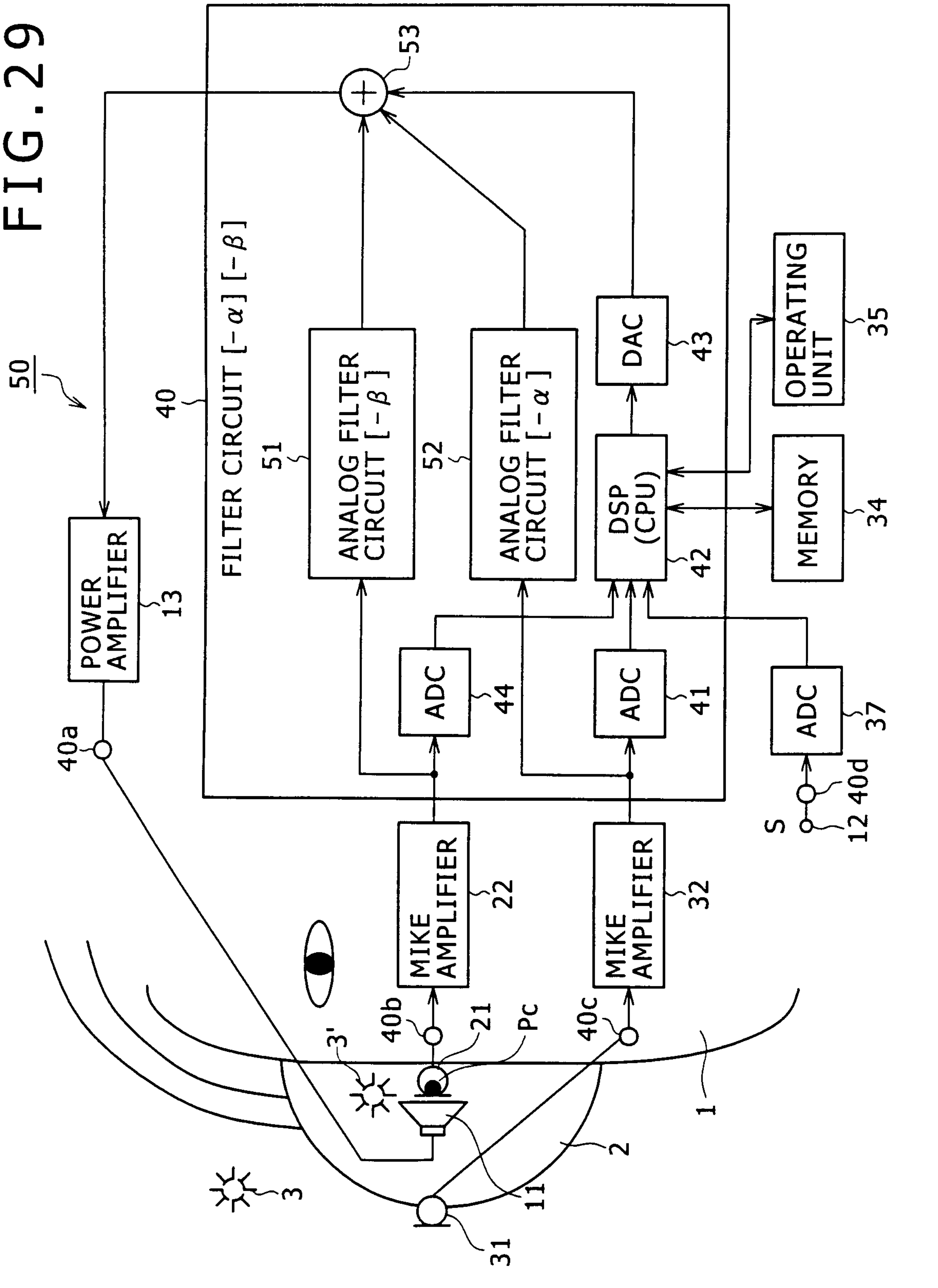
FIG. 29 is a block diagram of an example of a headphone device to which a sixth embodiment of the noise reducing device according to the present invention is applied.

Specifically, as with the third embodiment and the fourth embodiment shown in FIG. 23 and FIG. 25, the sixth embodiment has an analog filter system in parallel with a digital filter system. FIG. 29 is a block diagram of an example of a noise reducing device section 50 according to the sixth embodiment.

In the noise reducing device section 50 according to the sixth embodiment, as shown in FIG. 29, an analog filter circuit 51 for generating an analog noise reducing audio signal of the feedback system, an analog filter circuit 52 for generating an analog noise reducing audio signal of the feedforward system, and an adder circuit 53 are added to a filter circuit 40 having the configuration of FIG. 28.

An analog audio signal from a mike amplifier 22 is supplied to an A/D converter circuit 44, and also supplied to the analog filter circuit 51 for generating an analog noise reducing audio signal of the feedback system. The analog noise reducing audio signal from the analog filter circuit 51 is supplied to the adder circuit 53.

An analog audio signal from a mike amplifier 32 is supplied to an A/D converter circuit 41, and also supplied to the analog filter circuit 52 for generating an analog noise reducing audio signal of the feedforward system. The analog noise reducing audio signal from the analog filter circuit 52 is supplied to the adder circuit 53.

The adder circuit 53 is further supplied with an addition signal from a D/A converter circuit 43, which addition signal is obtained by adding together a noise reducing audio signal and an audio signal to be listened to. Then, an audio signal from the adding circuit 53 is supplied to a driver 11 via a power amplifier 15. The present embodiment thereby uses both of the noise reducing process of the feedback system and the noise reducing process of the feedforward system, and solves the problem in generating a noise reducing audio signal by only a digital filter. It is thus possible to provide a noise reducing device and a headphone device that can be realized for the general consumer.

Also in the sixth embodiment, at a time of switching and changing the noise mode, control operations as described in the foregoing first to third examples are performed under control of a control circuit 2323 in exactly the same manner as in the fifth embodiment.

OTHER EMBODIMENTS AND EXAMPLES OF MODIFICATION

In the first to sixth embodiments, each time the noise mode switching button of the operating unit is pressed, the NC filter formed in the digital filter circuit, or thus the noise mode, is changed. However, the present invention is applicable to a case where a suitable amount of noise reduction effect in using the NC filter in the same noise mode is determined.

Figure 30:
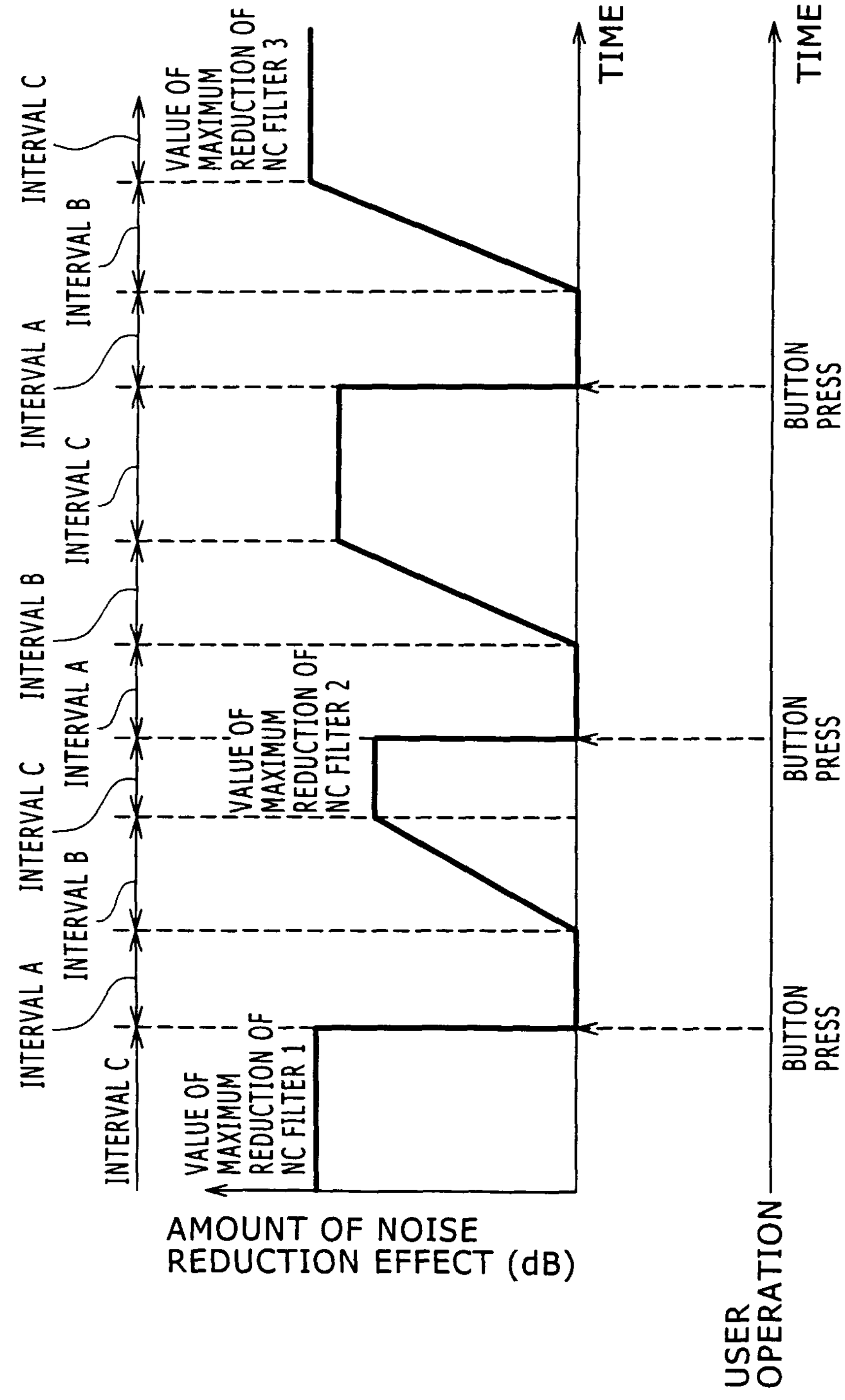
FIG. 30 is a diagram of assistance in explaining another example of operation of principal parts in an embodiment of the noise reducing device according to the present invention.

That is, in this case, each time a user operation via the operating unit is detected, the amount of maximum reduction in the noise reduction effect gradual increase interval B is changed to a first amount of maximum reduction, a second amount of maximum reduction, and a third amount of maximum reduction in the same NC filter, as shown in FIG. 30. The user can determine which amount of maximum reduction is effective as the amount of maximum reduction of the NC filter.

In the first to sixth embodiments, a notification is made by voice when a change is made to a noise mode corresponding to a different noise environment each time the mode switching button of the operating unit is pressed. However, the notification is not limited to voice. For example, the device may be provided with a display unit, and the name of each noise environment (noise mode) (such as "a platform in a railway station", "an airport", "the inside of a train", or the like) may be displayed on the display unit to make the notification to the user.

In addition, the operating units 25 and 35 are not limited to the push button, and operating means of various configurations can be used. For example, light hitting (tapping) of the headphone casing 2 or the like by the listener 1 may be detected, and as with the pressing of the push button, the timing of the detection output may be set as timing of changing to a next filter coefficient.

In this case, a vibration sensor may be provided separately as detecting means for detecting the hitting of the headphone casing 2 or the like. However, it is possible to detect the hitting of the headphone casing 2 or the like without providing a vibration sensor by forming the microphone 21 or 31 as follows.

Figure 31:
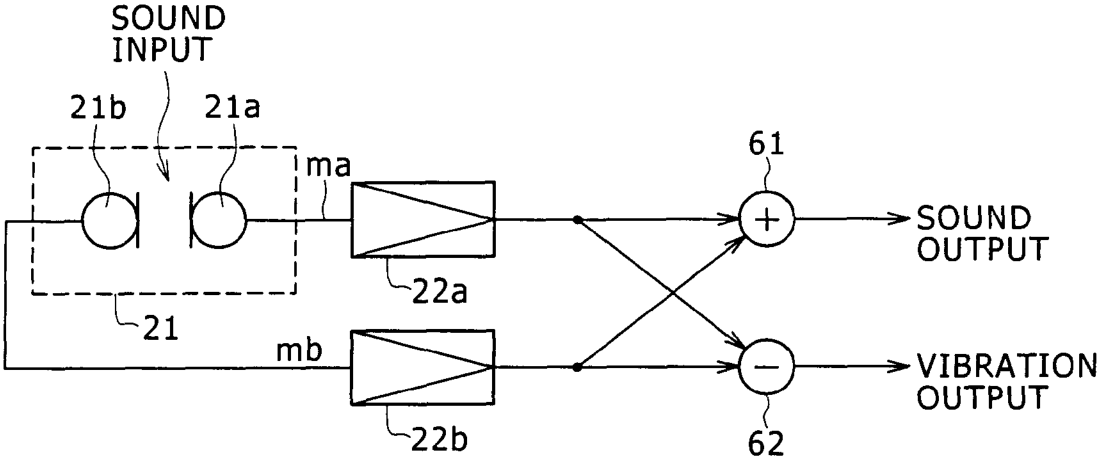
FIG. 31 is a diagram of assistance in explaining another example of operation of principal parts in an embodiment of the noise reducing device according to the present invention.

FIG. 31 shows an example in which an application is made to a microphone 21. In this case, two microphone elements

21a and 21b are provided as microphone 21 in a state in which the diaphragms of the two microphone elements 21a and 21b are opposed to each other. An audio signal to be collected is input between the opposed diaphragms of the two microphone elements 21a and 21b, as shown in FIG. 31.

Figure 32A:
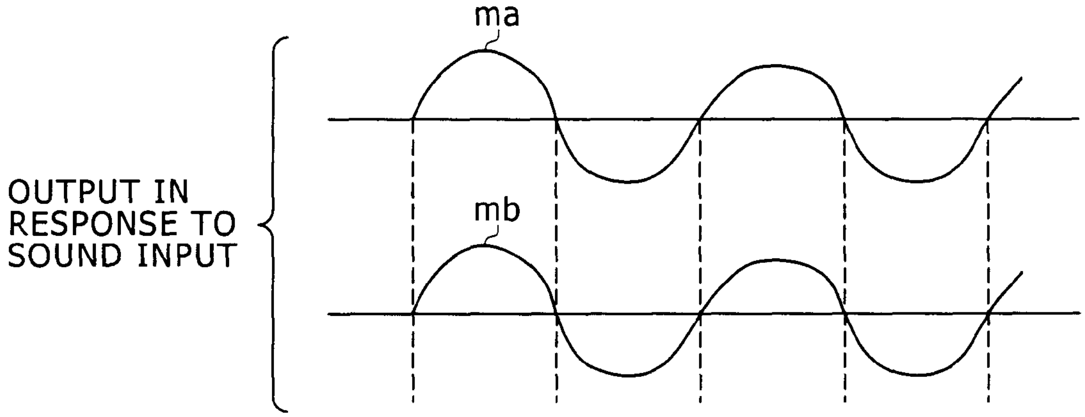
FIGS. 32A and 32B are diagrams of assistance in explaining another example of operation of principal parts in an embodiment of the noise reducing device according to the present invention.

Then, concave direction vibrations and convex direction vibrations of the respective diaphragms of the microphone element 21a and the microphone element 21b in response to the sound to be collected are in phase with each other. Thus, as shown in FIG. 32A, the output signal ma of the microphone element 21a and the output signal mb of the microphone element 21b are in phase with each other. Hence, by passing the collected sound signals ma and mb from the microphone elements 21a and 21b through mike amplifiers 22a and 22b, respectively, and adding together the collected sound signals ma and mb in an adder circuit 61, an output signal of the collected sound signals can be obtained.

Figure 32B:
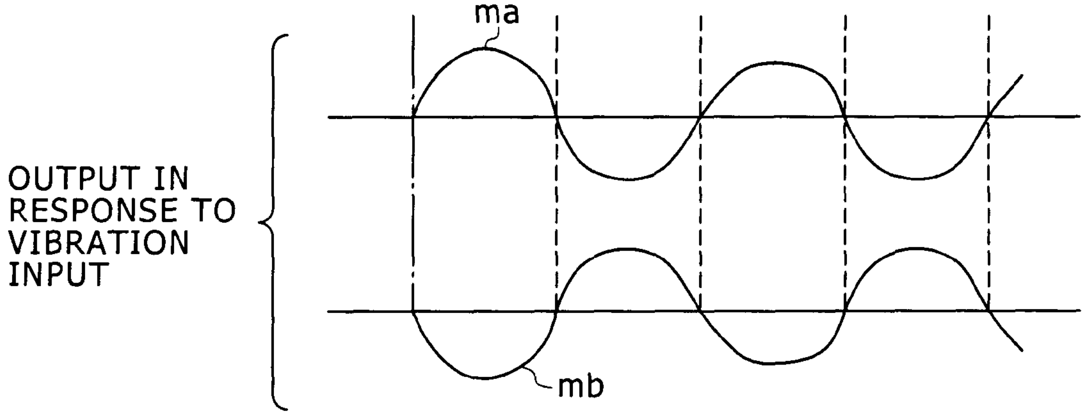

On the other hand, a vibration caused by hitting the headphone casing 2 is applied to the microphone 21 as a whole. Therefore concave direction vibrations and convex direction vibrations of the respective diaphragms of the microphone element 21a and the microphone element 21b are opposite in phase to each other. Thus, as shown in FIG. 32B, the output signal ma of the microphone element 21a and the output signal mb of the microphone element 21b are opposite in phase to each other. Hence, the components of the vibration caused by hitting the headphone casing 2 are removed in the adder circuit 61.

On the other hand, when the output signal of the mike amplifier 22a and the output signal of the mike amplifier 22b are subjected to subtraction in a subtracter circuit 62, the components of collected sound signals in phase with each other cancel each other out, whereas the components of the vibration caused by hitting the headphone casing 2, which components are opposite in phase to each other, are obtained.

Thus, it is possible to use the vibration components to detect the hitting of the casing by the user, and determine that the detection output is a noise mode switching instruction.

In addition, the above-described embodiments change the noise mode each time a user operation is performed. However, when a user operation is performed, the control circuit of the DSP may sequentially set each of NC filters in a plurality of noise modes from the memory 24 or 34 in the digital filter circuit for a predetermined fixed period to allow the listener to experience the noise reduction effect of each of the NC filters for the fixed period. In this case, the fixed period can include a noise reduction effect off interval, a noise reduction effect gradual increase interval B, a noise reduction effect maximum interval C, a notifying interval D, and a noise reduction effect gradual decrease interval E, so that the intervals for experiencing the noise reduction effect of each of the NC filters can be divided clearly.

Incidentally, in the case where a plurality of noise modes are thus consecutively presented to the user, an input indicating what number noise mode is most suitable is received from the listener after the listener finishes listening to the noise reduction effects of the NC filters in all the noise modes. Alternatively, the user performs a predetermined user operation while a noise mode judged to be an optimum noise mode by the user is selected. The user thereby determines the noise mode. In the latter case, it is desirable that the operation of sequentially selecting the plurality of noise modes to allow the listener to listen to each of the noise reduction effects in the noise modes for the fixed period be repeated a number of times for the plurality of filter coefficients.

Incidentally, in a case where the audio signal S to be listened to is being reproduced when the user is to determine an optimum noise mode, and thus it is difficult for the user to make the determination, it is desirable to mute the audio signal S forcefully for such a predetermined time as allows the user to determine noise reduction effect, when a user operation for changing the filter coefficient is performed.

In the description of each of the foregoing embodiments, the digital filter circuit in the FB filter circuit and the FF filter circuit is formed by using a DSP. However, the processing of the digital filter circuit can be performed by a software program using a microcomputer (or a microprocessor) in place of the DSP.

In addition, while in the foregoing embodiments, description has been made of a case where a noise reducing audio outputting device according to an embodiment of the present invention is a headphone device, the foregoing embodiments are applicable to earphone devices provided with a microphone, headset devices, and communication terminals such as portable telephone terminals and the like. In addition, noise reducing audio outputting devices according to embodiments of the present invention are applicable to portable type music reproducing devices combined with a headphone, an earphone, or a headset.

In this case, electric-to-acoustic converting means is not limited to a headphone driver, and is an earphone driver. In addition, acoustic-to-electric converting means may be of any structure as long as the acoustic-to-electric converting means can convert a vibration caused by a sound wave into an electric signal.

While the noise reducing device section in the foregoing embodiments is provided on the side of the headphone device, the noise reducing device section can also be provided in a portable type music reproducing device into which the headphone device is inserted, or on the side of a portable type music reproducing device ready for an earphone provided with a microphone or a headset.

In addition, while in the foregoing embodiments, description has been made of cases where the filter coefficient of the digital filter is changed, the present invention is also applicable to cases where a noise reduction characteristic is switched according to a noise environment by changing hardware of an analog filter.

Further, the present invention is not limited to noise reducing devices as described above, and is applicable to cases where an audio outputting device capable of switching and using a plurality of kinds of acoustic effect processes or other processes on an audio signal allows the acoustic effect processes or the other processes to be sequentially selected to check the effects of the processes.

It should be understood by those skilled in the art that various modifications, combinations, sub-combinations and alterations may occur depending on design requirements and other factors insofar as they are within the scope of the appended claims or the equivalents thereof.

What is claimed is:

1. An audio outputting device for switching a plurality of noise cancellation modes to perform noise cancellation on an audio signal, and acoustically reproducing and outputting the audio signal, said audio outputting device comprising:

a storage section configured to store a plurality of filter coefficient sets and a plurality of equalizer characteristic parameters, wherein each filter coefficient set corresponds to the noise cancellation modes and wherein each equalizer characteristic parameter corresponds to the filter coefficient sets;

a control section configured to, in response to changing noise cancellation performed on the audio signal from a first noise cancellation mode to a second noise cancellation mode, stop noise cancellation on said audio signal based on said first noise cancellation mode, select, from the storage section, a filter coefficient set corresponding to the second noise cancellation mode, generate, based on the selected filter coefficient set, a noise cancelling filter for performing noise cancellation in the second noise cancellation mode, output sound based on said audio signal unprocessed by either of said first noise cancellation mode and said second noise cancellation mode, perform noise cancellation on said audio signal based on the second noise cancellation mode via the noise cancelling filter after passage of a predetermined period of time, select, from the storage section, the equalizer characteristic parameter corresponding to the second noise mode filter coefficient set, and perform sound quality correction on the input audio signal based on the equalizer characteristic parameter.

2. The audio outputting device according to claim 1, wherein said control section notifies a user of a noise cancellation mode change when switching from said first noise cancellation mode to said second noise cancellation mode.

3. The audio outputting device according to claim 1, wherein said control section notifies a user of the second noise cancellation mode in response to switching from said first noise cancellation mode to said second noise cancellation mode.

4. The audio outputting device according to claim 1, wherein said control section gradually increases an effect of said second noise cancellation mode to a maximum value in response to said predetermined period of time having passed after stopping said first noise cancellation mode.

5. The audio outputting device according to claim 4, wherein the maximum value is based on the noise cancellation mode.

6. The audio outputting device according to claim 1, further comprising:

a detecting section for detecting a hitting of a casing of said audio outputting device, wherein said control section switches from said first noise cancellation mode to said second noise cancellation mode in response to said detecting section detecting a hitting of said casing.

7. The audio outputting device according to claim 1, wherein the sound quality correction includes amplitude-frequency characteristic correction and phase-frequency characteristic correction.

8. An audio outputting method for switching a plurality of noise cancellation modes to perform noise cancellation on an audio signal, and acoustically reproducing and outputting the audio signal, said audio outputting method comprising:

storing a plurality of filter coefficient sets and a plurality of equalizer characteristic parameters, wherein each filter coefficient set corresponds to the noise cancellation modes and wherein each equalizer characteristic parameter corresponds to the filter coefficient sets;

in response to changing noise cancellation performed on the audio signal from a first noise cancellation mode to a second noise cancellation mode, selecting, from the plurality of filter coefficient sets, a filter coefficient set corresponding to the second noise cancellation mode, generating, based on the selected filter coefficient set, a noise cancelling filter for performing noise cancellation in the second noise cancellation mode, stopping said noise cancellation on said audio signal based on the first noise cancellation mode, outputting sound based on said audio signal unprocessed by either of said first noise cancellation mode and said second noise cancellation mode, performing noise cancellation on said audio signal based on the second noise cancellation mode via the noise cancelling filter after passage of a predetermined period of time, selecting the equalizer characteristic parameter corresponding to the second noise mode filter coefficient set, and performing sound quality correction on the input audio signal based on the equalizer characteristic parameter.

9. A non-transitory computer-readable medium storing computer readable instructions thereon for switching a plurality of noise cancellation modes to perform noise cancellation on an audio signal that when executed by an audio outputting device cause the audio outputting device to perform a method comprising:

storing a plurality of filter coefficient sets and a plurality of equalizer characteristic parameters, wherein each filter coefficient set corresponds to the noise cancellation modes and wherein each equalizer characteristic parameter corresponds to the filter coefficient sets;

in response to changing noise cancellation performed on the audio signal from a first noise cancellation mode to a second noise cancellation mode, selecting, from the plurality of filter coefficient sets, a filter coefficient set corresponding to the second noise cancellation mode, stopping said noise cancellation on said audio signal based on the first noise cancellation mode, outputting sound based on said audio signal unprocessed by either of said first noise cancellation mode and said second noise cancellation mode, performing noise cancellation on said audio signal based on the second noise cancellation mode via the noise cancelling filter after passage of a predetermined period of time, selecting the equalizer characteristic parameter corresponding to the second noise mode filter coefficient set, and performing sound quality correction on the input audio signal based on the equalizer characteristic parameter.

10. A noise reducing device comprising:

a storage section configured to store a plurality of filter coefficient sets and a plurality of equalizer characteristic parameters, wherein each filter coefficient set corresponds to the noise cancellation modes and wherein each equalizer characteristic parameter corresponds to the filter coefficient sets;

a sound collecting section configured to collect sound and output a noise signal;

a noise reducing audio signal generating section configured to generate a noise reducing audio signal based on said noise signal and a selected filter coefficient set;

a switching section configured to switch from one noise cancellation mode to another noise cancellation mode;

an equalizer section configured to perform sound quality correction on an input audio signal based on an equalizer characteristic parameter;

a control section configured to, in response to making said switching section switch from the first noise cancellation mode to the second noise cancellation mode, stop noise cancellation on the audio signal based on the filter coefficient set corresponding to the first noise cancellation mode, selects, from the storage section, the filter coefficient set corresponding to the second noise cancellation mode, output sound based on unprocessed input audio signal, perform noise cancellation on the noise signal based on the selected filter coefficient set after passage of a predetermined period of time, generate a noise reducing audio signal based on the selected filter coefficient set, select, from the storage section, the equalizer characteristic parameter corresponding to the selected filter coefficient set, and perform, via the equalizer section, sound quality correction on the input audio signal based on the equalizer characteristic parameter, and generate a sound quality correction audio signal;

an electric-to-acoustic converting section configured to acoustically reproduce sound based on said noise reducing audio signal and said sound quality correction audio signal.

11. The noise reducing device according to claim 10, wherein in response to making said switching section switch said first noise cancellation mode, said control section notifies a user of the switch.

12. The noise reducing device according to claim 11, wherein said control section notifies the user before said first noise cancellation mode is switched.

13. The noise reducing device according to claim 11, wherein in response to making said switching section switch said first noise cancellation mode, said control section notifies the user of the second noise cancellation mode.

14. The noise reducing device according to claim 13, wherein said control section notifies the user before said first noise reducing cancellation mode is switched.

15. The noise reducing device according to claim 10, wherein said control section gradually increases an effect of said second noise cancellation mode to a maximum value after passage of said predetermined period of time.

16. The audio outputting device according to claim 15, wherein the maximum value is based on the noise cancellation mode.

17. The audio outputting device according to claim 16, wherein the maximum value is based on the type of noise cancellation mode.

18. The noise reducing device according to claim 10, further comprising:

a detecting section configured to detect a hitting of a casing of said noise reducing device, wherein said control section controls said detecting section to change said first noise cancellation mode in response to said detecting section detecting a hitting of said casing.

19. A noise reducing method comprising:

storing a plurality of filter coefficient sets and a plurality of equalizer characteristic parameters, wherein each filter coefficient set corresponds to the noise cancellation modes and wherein each equalizer characteristic parameter corresponds to the filter coefficient sets;

collecting sound and outputting a noise signal;

generating a noise reducing audio signal based on said noise signal and a selected filter coefficient set;

switching from one noise cancellation mode to another noise cancellation mode;

controlling, in response to switching said first noise cancellation mode to the second noise cancellation mode, stopping noise cancellation on the audio signal based on the filter coefficient set corresponding to the first noise cancellation mode, selecting, from the storage section, the filter coefficient set corresponding to the second noise cancellation mode, outputting sound based on unprocessed input audio signal, performing noise cancellation on the noise signal based on the selected filter coefficient set after passage of a predetermined period of time, generating a noise reducing audio signal based on the selected filter coefficient set, selecting the equalizer characteristic parameter corresponding to the selected filter coefficient set, performing sound quality correction on the input audio signal based on the equalizer characteristic parameter, and generating a sound quality correction audio signal; and acoustically reproducing sound based on said noise reducing audio signal and said sound quality corrected audio signal.

20. An audio outputting device for switching a plurality of noise cancellation modes to perform noise cancellation on an audio signal, and acoustically reproducing and outputting the audio signal, said audio outputting device comprising:

storage means for storing a plurality of filter coefficient sets and a plurality of equalizer characteristic parameters, wherein each filter coefficient set corresponds to the noise cancellation modes and wherein each equalizer characteristic parameter corresponds to the filter coefficient sets;

control means for, in response to changing noise cancellation performed on the audio signal from a first noise cancellation mode to a second noise cancellation mode, selecting, from the storage means, a filter coefficient set corresponding to the second noise cancellation mode, generating, based on the selected filter coefficient set, a noise cancelling filter for performing noise cancellation in the second noise cancellation mode, stopping said noise cancellation on said audio signal, outputting sound based on said audio signal unprocessed by either of said first noise cancellation mode and said second noise cancellation mode, performing said second noise cancellation mode on said audio signal via the noise cancelling filter after passage of a predetermined period of time, selecting the equalizer characteristic parameter corresponding to the second noise mode filter coefficient set, and performing sound quality correction on the input audio signal based on the equalizer characteristic parameter.

* * * * *